US009570442B1

(12) United States Patent
Liu et al.

(10) Patent No.: US 9,570,442 B1
(45) Date of Patent: Feb. 14, 2017

(54) APPLYING CHANNEL STRESS TO FIN FIELD-EFFECT TRANSISTORS (FETS) (FINFETS) USING A SELF-ALIGNED SINGLE DIFFUSION BREAK (SDB) ISOLATION STRUCTURE

(71) Applicant: QUALCOMM Incorporated, San Diego, CA (US)

(72) Inventors: Yanxiang Liu, San Diego, CA (US); Jun Yuan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/133,832

(22) Filed: Apr. 20, 2016

(51) Int. Cl.
| | |
|---|---|
| H01L 21/00 | (2006.01) |
| H01L 27/088 | (2006.01) |
| H01L 29/06 | (2006.01) |
| H01L 27/092 | (2006.01) |
| H01L 21/8238 | (2006.01) |
| H01L 21/8234 | (2006.01) |

(52) U.S. Cl.
CPC ... *H01L 27/0886* (2013.01); *H01L 21/823431* (2013.01); *H01L 21/823462* (2013.01); *H01L 21/823481* (2013.01); *H01L 21/823821* (2013.01); *H01L 27/0924* (2013.01); *H01L 29/0649* (2013.01)

(58) Field of Classification Search
CPC ............. H01L 27/0886; H01L 27/0924; H01L 29/0649; H01L 21/823821; H01L 21/823481; H01L 21/823462; H01L 21/823431

See application file for complete search history.

(56) References Cited

U.S. PATENT DOCUMENTS

| | | | |
|---|---|---|---|
| 7,436,030 B2 | 10/2008 | Yang et al. | |
| 7,485,508 B2 | 2/2009 | Dyer et al. | |
| 9,123,773 B1 | 9/2015 | Shen et al. | |
| 9,209,179 B2 | 12/2015 | Lee et al. | |
| 9,263,516 B1 | 2/2016 | Wu et al. | |
| 2009/0315115 A1 | 12/2009 | Zhang et al. | |
| 2015/0294969 A1* | 10/2015 | Lee ..................... | H01L 27/0886 257/401 |
| 2016/0225762 A1* | 8/2016 | Zang ................... | H01L 27/0886 |

* cited by examiner

*Primary Examiner* — Nicholas Tobergte
(74) *Attorney, Agent, or Firm* — Withrow & Terranova, PLLC

(57) ABSTRACT

Aspects for applying channel stress to Fin field-effect transistors (FETs) (FinFETs) using a self-aligned single diffusion break (SDB) isolation structure are disclosed. In one aspect, a FinFET-based circuit is provided. The FinFET-based circuit includes a semiconductor substrate and a Fin formed from the semiconductor substrate. The FinFET-based circuit also includes first and second FinFETs, each corresponding to the Fin. The FinFET-based circuit also includes a gate region disposed between the first FinFET and the second FinFET. An SDB isolation structure is formed in the Fin between the first FinFET and the second FinFET. The self-aligned SDB isolation structure is self-aligned with the gate region and electrically isolates the first FinFET and the second FinFET. The self-aligned SDB isolation structure applies stress to a first channel corresponding to the first FinFET and to a second channel corresponding to the second FinFET.

28 Claims, 21 Drawing Sheets

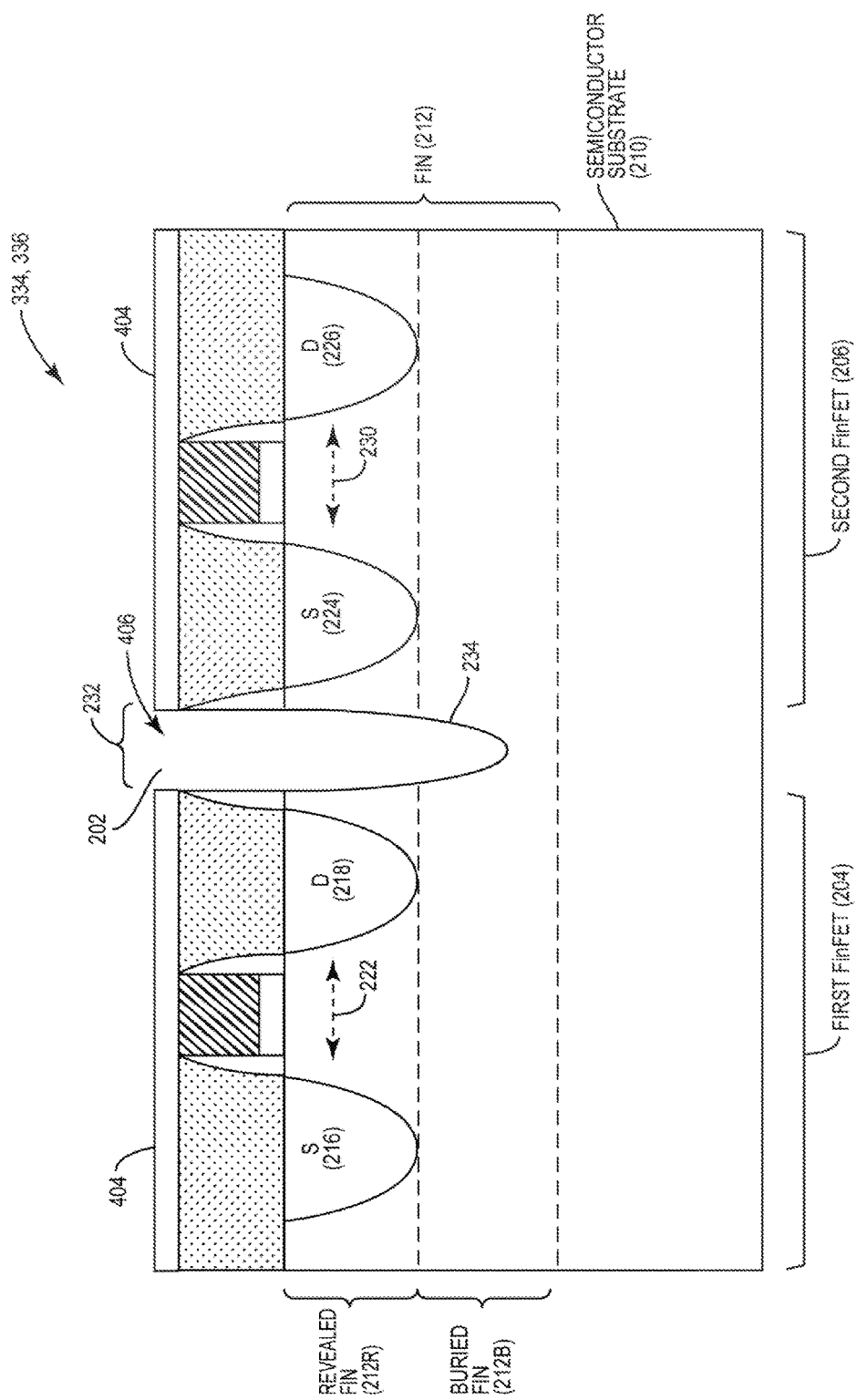

APPLYING CHANNEL STRESS TO FIN FIELD-EFFECT TRANSISTORS (FETS) (FINFETS) USING A SELF-ALIGNED SINGLE DIFFUSION BREAK (SDB) ISOLATION STRUCTURE

BACKGROUND

I. Field of the Disclosure

The technology of the disclosure relates generally to Fin field-effect transistors (FETs) (FinFETs), and particularly to applying stress to a channel region of a FinFET.

II. Background

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices.

As electronic devices become more complex in functionality, so does the need to include a greater number of transistors in such devices. However, as electronic devices are required to be provided in increasingly smaller packages, such as in mobile devices, for example, there is a need to provide a greater number of transistors in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) and providing smaller parasitic capacitances resulting in reduced circuit delay. However, as channel length in planar transistors is reduced such that the channel length approaches a magnitude similar to the depletion layer widths, short channel effects (SCEs) can occur that degrade performance. More specifically, SCEs in planar transistors cause increased current leakage, reduced threshold voltage, and/or threshold voltage roll-off (i.e., reduced threshold voltage at shorter gate lengths).

In this regard, to address the need to scale down channel lengths in transistors while avoiding or mitigating SCEs, transistor designs alternative to planar transistors have been developed. One such alternative transistor design includes a Fin field-effect transistor (FET) (FinFET) that provides a conducting channel via a "Fin" formed from a substrate. Material is wrapped around the Fin to form the gate of the device. For example, FIG. 1 illustrates an exemplary FinFET 100. The FinFET 100 includes a semiconductor substrate 102 and a Fin 104 formed from the semiconductor substrate 102. An oxide layer 106 is included on either side of the Fin 104. The FinFET 100 includes a source 108 and a drain 110 interconnected by the Fin 104 such that an interior portion of the Fin 104 serves as a conduction channel 112 between the source 108 and drain 110. The Fin 104 is surrounded by a "wrap-around" gate 114. The wrap-around structure of the gate 114 provides better electrostatic control over the channel 112, and thus helps reduce the leakage current and overcoming other SCEs.

Although a FinFET, such as the FinFET 100, reduces leakage current and avoids or mitigates SCEs compared to planar transistors, ICs employing FinFETs continue to need increased performance. One way to achieve increased performance in a FET, including a FinFET, is to apply stress to the channel so as to alter carrier mobility within the channel. For example, stress applied to a channel of an N-type FinFET causes corresponding electrons to flow more easily, while stress applied to a channel of a P-type FinFET causes corresponding holes to flow more easily. In either case, stress applied to a channel is designed to change the carrier mobility so as to increase conductance in the channel, thus increasing performance of the corresponding FinFET. Such stress is achieved by applying compressive or tensile pressure on a channel. However, conventional methods to apply stress in FETs, such as by growing epitaxial layers on a substrate or employing silicide contacts, for example, are more complex and less effective when employed with FinFETs.

SUMMARY OF THE DISCLOSURE

Aspects disclosed herein include applying channel stress to Fin field-effect transistors (FETs) (FinFETs) using a self-aligned single diffusion break (SDB) isolation structure. In one aspect, a FinFET-based circuit is provided. The FinFET-based circuit includes a semiconductor substrate and a Fin formed from the semiconductor substrate. The FinFET-based circuit also includes a first FinFET and a second FinFET, each of which corresponds to the Fin. The FinFET-based circuit also includes a gate region disposed between the first FinFET and the second FinFET. To apply channel stress to the first and second FinFETs, a self-aligned SDB isolation structure is formed in the Fin between the first FinFET and the second FinFET. The self-aligned SDB isolation structure is self-aligned with the gate region and electrically isolates the first FinFET and the second FinFET. Additionally, the self-aligned SDB isolation structure applies stress to a first channel corresponding to the first FinFET and to a second channel corresponding to the second FinFET. Applying such channel stress can increase carrier mobility within the first and second channels, thus increasing the performance of the first and second FinFETs. The self-aligned SDB isolation structure can be formed using conventional SDB processes, such that channel stress can be applied to the FinFET-based circuit while reducing or avoiding increased fabrication costs and complexity.

In this regard in one aspect, a FinFET-based circuit is provided. The FinFET-based circuit comprises a semiconductor substrate and a Fin formed from the semiconductor substrate. The FinFET-based circuit further comprises a first FinFET corresponding to the Fin and a second FinFET corresponding to the Fin. The FinFET-based circuit further comprises a gate region disposed between the first FinFET and the second FinFET. The FinFET-based circuit further comprises a self-aligned SDB isolation structure formed in the Fin between the first FinFET and the second FinFET and self-aligned with the gate region. The self-aligned SDB isolation structure electrically isolates the first FinFET and the second FinFET and applies stress to a first channel corresponding to the first FinFET and to a second channel corresponding to the second FinFET.

In another aspect, a FinFET-based circuit is provided. The FinFET-based circuit comprises a means for providing a semiconductor substrate. The FinFET-based circuit further comprises a means for forming a Fin from the semiconductor substrate. The FinFET-based circuit further comprises a means for forming a first FinFET corresponding to the Fin. The FinFET-based circuit further comprises a means for forming a second FinFET corresponding to the Fin. The FinFET-based circuit further comprises a means for disposing a gate region between the first FinFET and the second FinFET. The FinFET-based circuit further comprises a means for forming a self-aligned SDB isolation structure in the Fin between the first FinFET and the second FinFET and self-aligned with the gate region. The self-aligned SDB isolation structure electrically isolates the first FinFET and the second FinFET and applies stress to a first channel corresponding to the first FinFET and to a second channel corresponding to the second FinFET.

In another aspect, a method of fabricating a FinFET-based circuit is provided. The method comprises providing a semiconductor substrate comprising a Fin formed from the semiconductor substrate, a first FinFET corresponding to the Fin, a second FinFET corresponding to the Fin, and a gate region disposed between the first FinFET and the second FinFET. The method further comprises forming a self-aligned SDB isolation structure in the Fin between the first FinFET and the second FinFET and self-aligned with the gate region. The self-aligned SDB isolation structure electrically isolates the first FinFET and the second FinFET and applies stress to a first channel corresponding to the first FinFET and to a second channel corresponding to the second FinFET.

BRIEF DESCRIPTION OF THE FIGURES

FIGS. 4A-4M are cross-sectional diagrams illustrating the FinFET-based circuit in FIG. 2B at each step in the process of fabrication in FIGS. 3A-3B;

DETAILED DESCRIPTION

Figure 1:
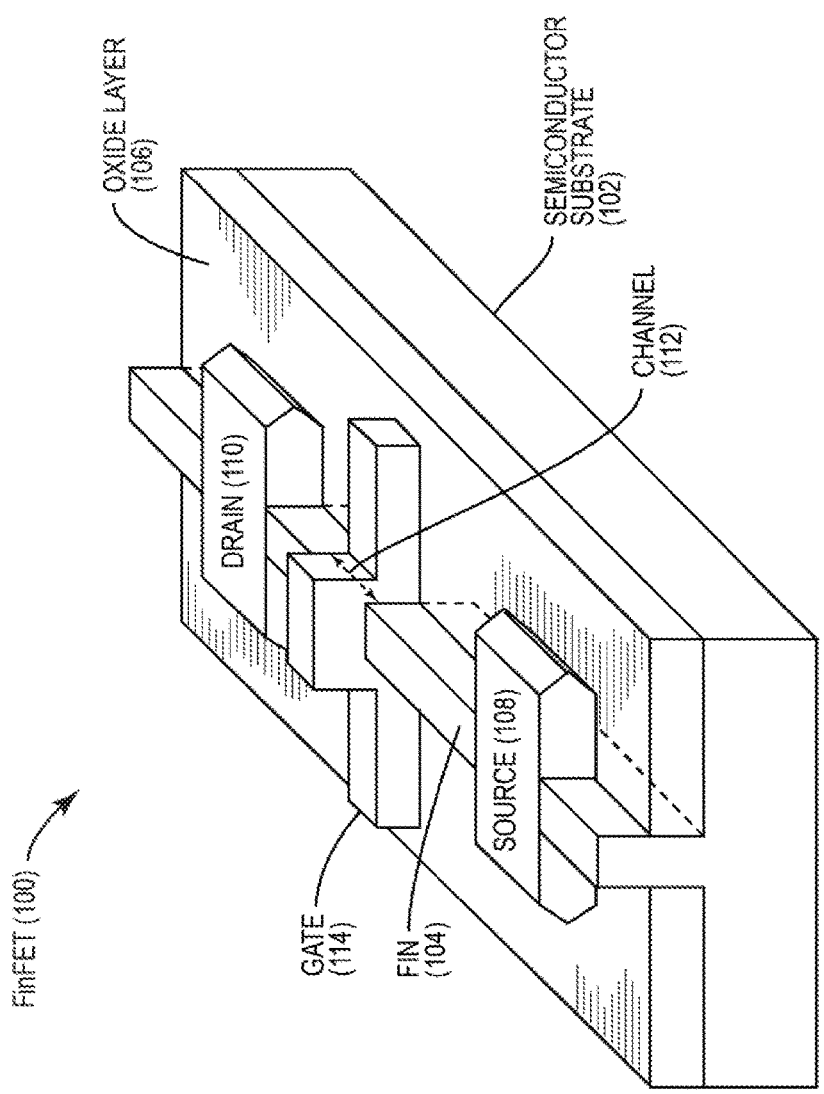
FIG. 1 is a perspective diagram of a conventional Fin field-effect transistor (FET) (FinFET)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include applying channel stress to Fin field-effect transistors (FETs) (FinFETs) using a self-aligned single diffusion break (SDB) isolation structure. In one aspect, a FinFET-based circuit is provided. The FinFET-based circuit includes a semiconductor substrate and a Fin formed from the semiconductor substrate. The FinFET-based circuit also includes a first FinFET and a second FinFET, each of which corresponds to the Fin. The FinFET-based circuit also includes a gate region disposed between the first FinFET and the second FinFET. To apply channel stress to the first and second FinFETs, a self-aligned single diffusion break (SDB) isolation structure is formed in the Fin between the first FinFET and the second FinFET. The self-aligned SDB isolation structure is self-aligned with the gate region and electrically isolates the first FinFET and the second FinFET. Additionally, the self-aligned SDB isolation structure applies stress to a first channel corresponding to the first FinFET and to a second channel corresponding to the second FinFET. Applying such channel stress can increase carrier mobility within the first and second channels, thus increasing the performance of the first and second FinFETs. The self-aligned SDB isolation structure can be formed using conventional SDB processes, such that channel stress can be applied to the FinFET-based circuit while reducing or avoiding increased fabrication costs and complexity.

Figure 2A:
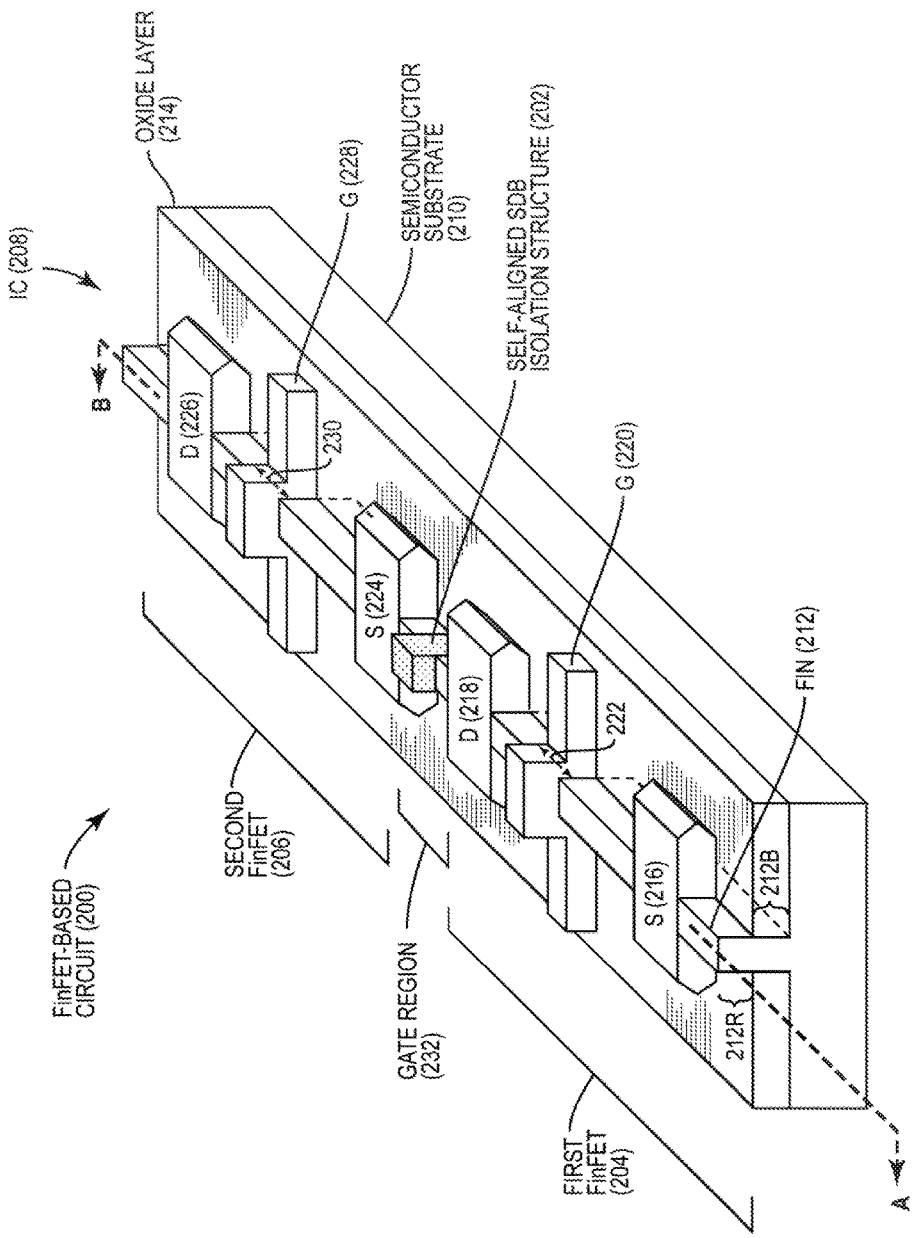
FIG. 2A is a perspective diagram of an exemplary FinFET-based circuit having a self-aligned single diffusion break (SDB) isolation structure separating a first FinFET and a second FinFET, wherein the self-aligned SDB isolation structure applies channel stress to the first and second FinFETs.
Figure 2B:
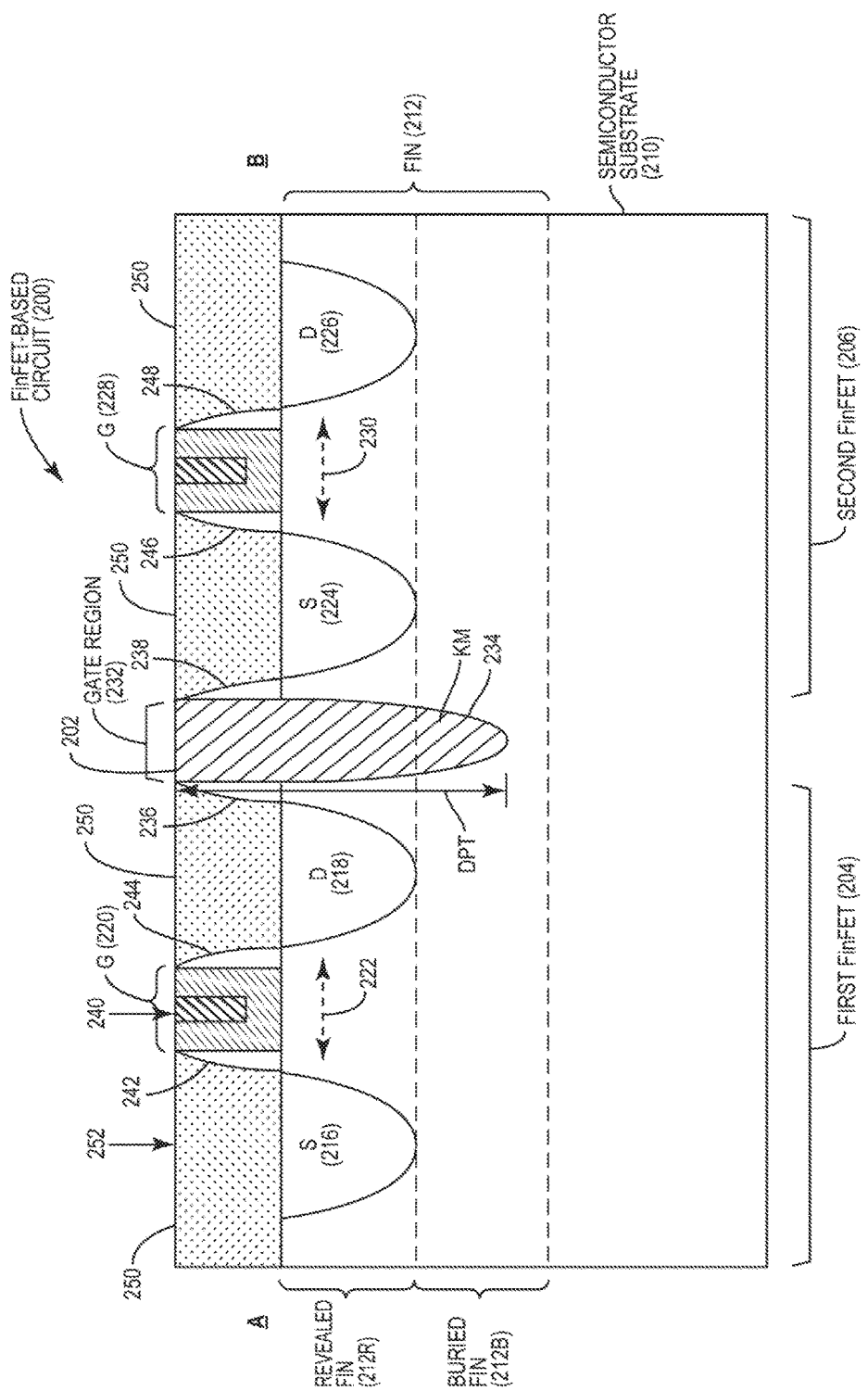
FIG. 2B is a cross-sectional diagram of the FinFET-based circuit having the self-aligned SDB isolation structure in FIG. 2A.

In this regard, FIGS. 2A and 2B illustrate an exemplary FinFET-based circuit 200 employing a self-aligned SDB isolation structure 202 that separates a first FinFET 204 and a second FinFET 206, and applies channel stress to the first and second FinFETs 204, 206. The FinFET-based circuit 200 as described herein is designed such that it can be integrated into an integrated circuit (IC) 208. FIG. 2A illustrates a perspective view of the FinFET-based circuit 200, while FIG. 2B illustrates a cross-sectional view of the FinFET-based circuit 200. Components of the FinFET-based circuit 200 are referred to with common element numbers in FIGS. 2A and 2B.

With reference to FIGS. 2A and 2B, the FinFET-based circuit 200 includes a semiconductor substrate 210 and a Fin 212 formed from the semiconductor substrate 210. An oxide layer 214 is formed on top of the semiconductor substrate 210 and the Fin 212. As described in more detail below, the oxide layer 214 is polished and etched such that the oxide layer 214 is included on either side of the Fin 212. The first FinFET 204 and the second FinFET 206 each correspond to the Fin 212. In particular, the first FinFET 204 includes a source 216, a drain 218, and a gate 220. The Fin 212 connects the source 216 and the drain 218 such that an interior portion of the Fin 212 corresponding to the first FinFET 204 serves as a first conduction channel 222 ("first channel 222") between the source 216 and drain 218. The gate 220 wraps around the Fin 212 and is configured to receive an input voltage for the first FinFET 204. Similarly, the second FinFET 206 includes a source 224, a drain 226, and a gate 228. The Fin 212 connects the source 224 and the drain 226 such that an interior portion of the Fin 212 corresponding to the second FinFET 206 serves as a second conduction channel 230 ("second channel 230") between the source 224 and drain 226. The gate 228 wraps around the Fin 212 and is configured to receive an input voltage for the second FinFET 206.

With continuing reference to FIGS. 2A and 2B, the FinFET-based circuit 200 also includes a gate region 232 disposed between the first FinFET 204 and the second FinFET 206. The self-aligned SDB isolation structure 202 is formed in the Fin 212 between the first and second FinFETs 204, 206. In particular, the self-aligned SDB isolation structure 202 is self-aligned with the gate region 232 and electrically isolates the first and second FinFETs 204, 206. In this aspect and as illustrated in FIG. 2B, the self-aligned SDB isolation structure 202 includes an SDB trench 234 formed in the Fin 212 using an SDB process. Such an SDB process can include etching a portion of the Fin 212 to form a single diffusion break (e.g., the SDB trench 234) in the Fin 212. For example, the SDB trench 234 can be etched to a depth DPT such that the SDB trench 234 is formed in the portion of the Fin 212 positioned above the oxide layer 214 (e.g., the "revealed Fin 212R") and continues partially into the portion of the Fin 212 buried under the oxide layer 214 (e.g., the "buried Fin 212B").

In this regard, with reference to FIG. 2B, the self-aligned SDB isolation structure 202 is created by forming the SDB trench 234 between a first spacer 236 disposed adjacent to the gate region 232, and a second spacer 238 disposed adjacent to the gate region 232 opposite of the first spacer 236. As a non-limiting example, the first and second spacers 236, 238 can be formed from materials such as silicon nitride, silicon carbon nitride, or silicon carbon oxide nitride. Forming the SDB trench 234 between the first and second spacers 236, 238 in this manner results in the corresponding self-aligned SDB isolation structure 202 being self-aligned with the gate region 232. The SDB trench 234 is filled with a dielectric material (KM) such as, for example, silicon dioxide and silicon nitride, and extends so that the self-aligned SDB isolation structure 202 is planar with a top surface 240 of the gates 220, 228. Also in this aspect, as illustrated in FIG. 2B, a first spacer 242 and a second spacer 244 correspond to the gate 220 of the first FinFET 204, while a first spacer 246 and a second spacer 248 correspond to the gate 228 of the second FinFET 206. Additionally, an interlayer dielectric oxide (ILD) 250 is disposed on an outer side of the first spacers 236, 242, and 246 and the second spacers 238, 244, and 248, thus creating a planar top surface 252 for the FinFET-based circuit 200.

As noted above, the self-aligned SDB isolation structure 202 applies stress to the first channel 222 and the second channel 230. Applying such channel stress increases carrier mobility within the first and second channels 222, 230, thus increasing the performance of the first and second FinFETs 204, 206. For example, if the first and second FinFETs 204, 206 are employed as N-type FinFETS (e.g., first and second N-type FinFETS 204, 206), the dielectric material (KM) used to fill the SDB trench 234 can include porous silicon dioxide. Annealing the FinFET-based circuit 200, such as by using laser annealing or rapid thermal annealing, causes the silicon dioxide to shrink so as to apply tensile stress to the first and second channels 222, 230. Such tensile stress changes the mobility of electrons (i.e., carrier mobility) in the first and second N-type FinFETs 204, 206 so as to increase conductance in the first and second channels 222, 230, thus increasing performance. As another example, if the first and second FinFETs 204, 206 are employed as P-type FinFETs (e.g., first and second P-type FinFETS 204, 206), the dielectric material (KM) used to fill the SDB trench 234 can include a layer of silicon buried by silicon dioxide or silicon nitride. Annealing the FinFET-based circuit 200 filled in this manner causes the dielectric material (KM) to expand, causing compressive stress to be applied to the first and second channels 222, 230. Such compressive stress changes the mobility of holes (i.e., carrier mobility) in the first and second P-type FinFETs 204, 206 so as to increase conductance in the first and second channels 222, 230, thus increasing performance. Additionally, a depth DPT of the SDB trench 234 can be sized to tune the stress applied to the first and second channels 222, 230. For example, the SDB trench 234 can be formed with the depth DPT between approximately 60 nanometers (nm) and 100 nm to apply stress to the first and second channels 222, 230. Further, because the self-aligned SDB isolation structure 202 can be formed using conventional SDB processes, applying channel stress as described herein can be achieved while reducing or avoiding increased fabrication costs and complexity.

Figure 3A:
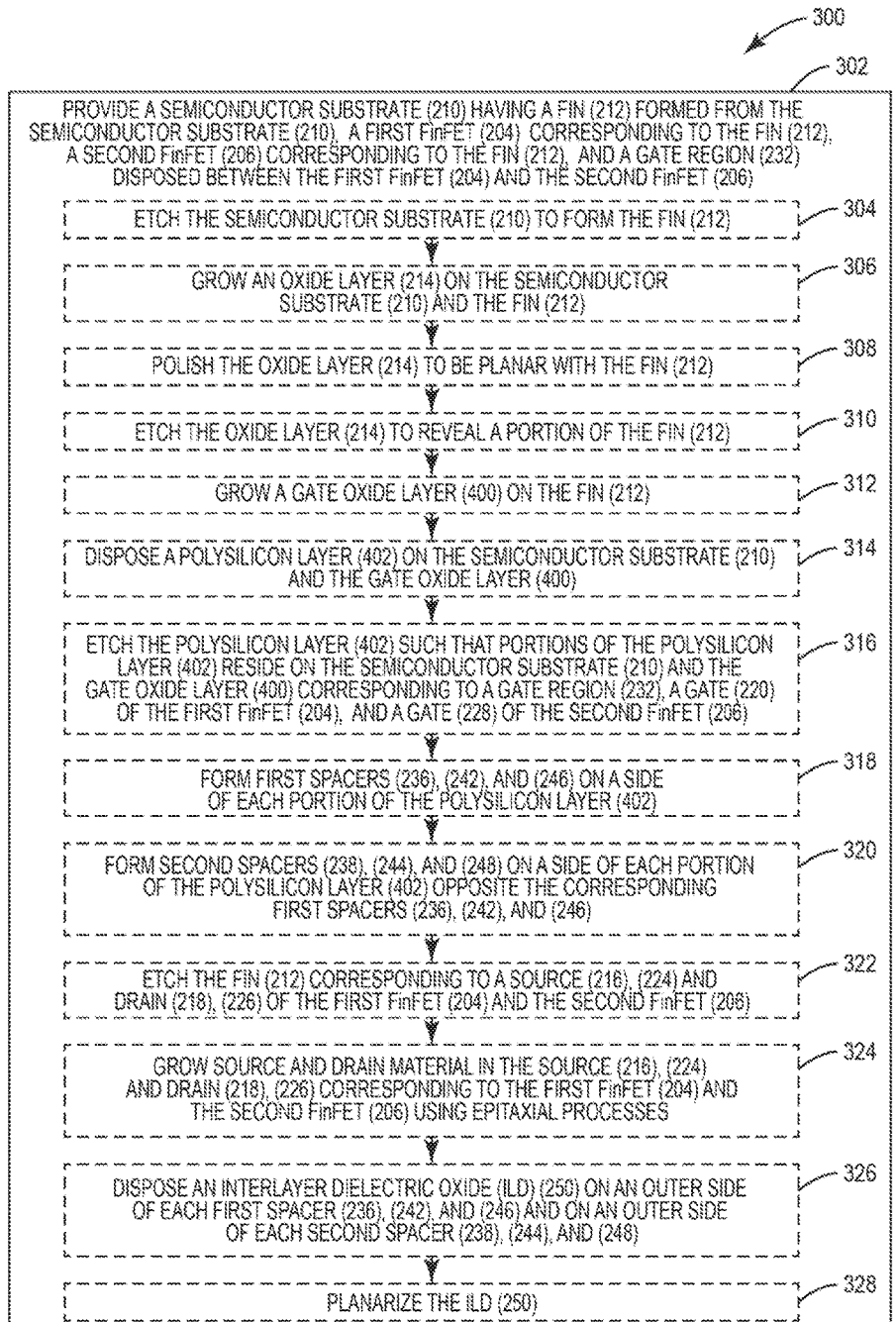
FIGS. 3A-3B illustrate a flowchart illustrating an exemplary process of fabricating the FinFET-based circuit having the self-aligned SBD isolation structure in FIG. 2A.
Figure 3B:
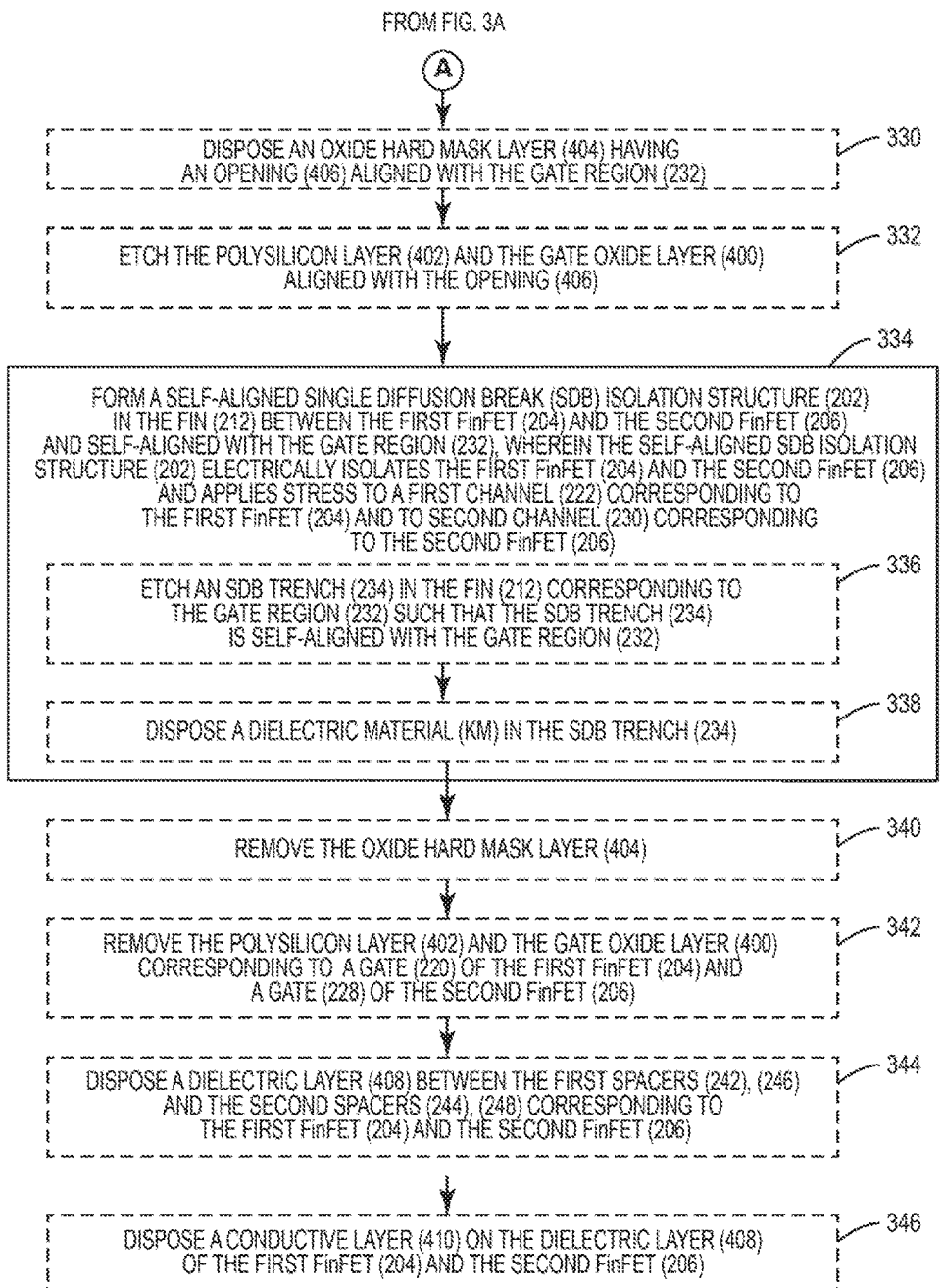

FIGS. 3A-3B illustrate an exemplary fabrication process 300 employed to fabricate the FinFET-based circuit in FIGS. 2A and 2B. Further, FIGS. 4A-4M provide cross-sectional diagrams illustrating the FinFET-based circuit 200 during the various steps of the fabrication process 300. The cross-sectional diagrams illustrating the FinFET-based circuit 200 in FIGS. 4A-4M will be discussed in conjunction with the discussion of the exemplary fabrication steps in the fabrication process 300 in FIGS. 3A-3B.

In this regard, the fabrication process 300 beginning in FIG. 3A includes providing the semiconductor substrate 210 having the Fin 212 formed from the semiconductor substrate 210, the first FinFET 204 corresponding to the Fin 212, the second FinFET 206 corresponding to the Fin 212, and the gate region 232 disposed between the first FinFET 204 and the second FinFET 206 (block 302 and FIGS. 4A-4G). In this aspect, the fabrication process 300 can include multiple steps to provide the semiconductor substrate 210 in block 302. For example, block 302 can include etching the semiconductor substrate 210 to form the Fin 212 (block 304 and FIG. 4A). Further, although not visible in the cross-sectional view of FIG. 4A, block 302 can also include growing the oxide layer 214 on the semiconductor substrate 210 and the Fin 212 (block 306), polishing the oxide layer 214 to be planar with the Fin 212 (block 308), and etching the oxide layer 214 to reveal a portion of the Fin 212 (e.g., the "revealed Fin 212R") (block 310). Block 302 can also include growing a gate oxide layer 400 on the Fin 212 (block 312 and FIG. 4B). Block 302 can also include disposing a polysilicon layer 402 on the semiconductor substrate 210 and the gate oxide layer 400 (block 314 and FIG. 4C). Further, block 302 can include etching the polysilicon layer 402 such that portions of the polysilicon layer 402 reside on the semiconductor substrate 210 and the gate oxide layer 400 corresponding to the gate region 232, the gate 220 of the first FinFet 204, and the gate 228 of the second FinFET 206 (block 316 and FIG. 4D).

Figure 4A:
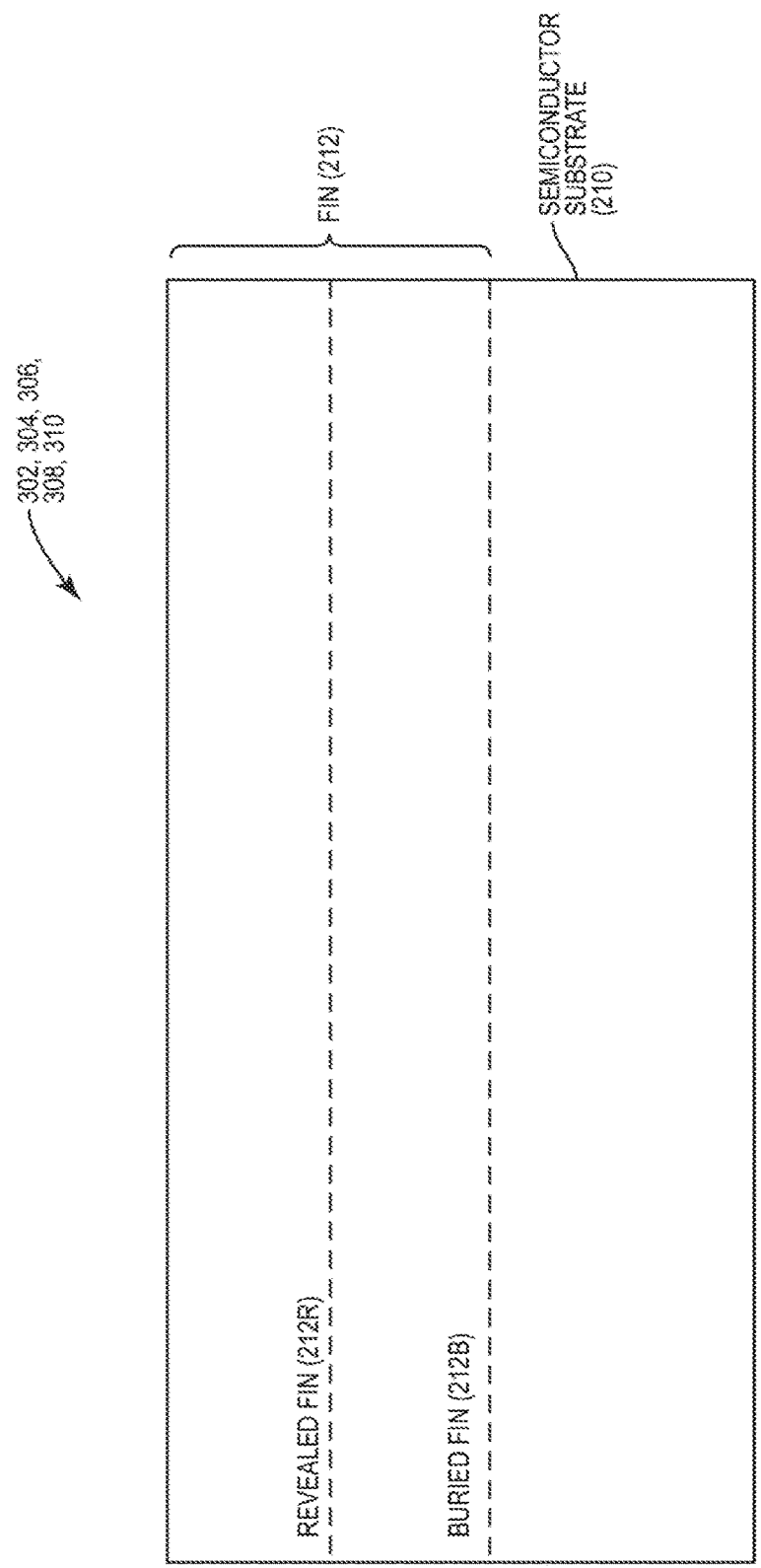
Figure 4B:
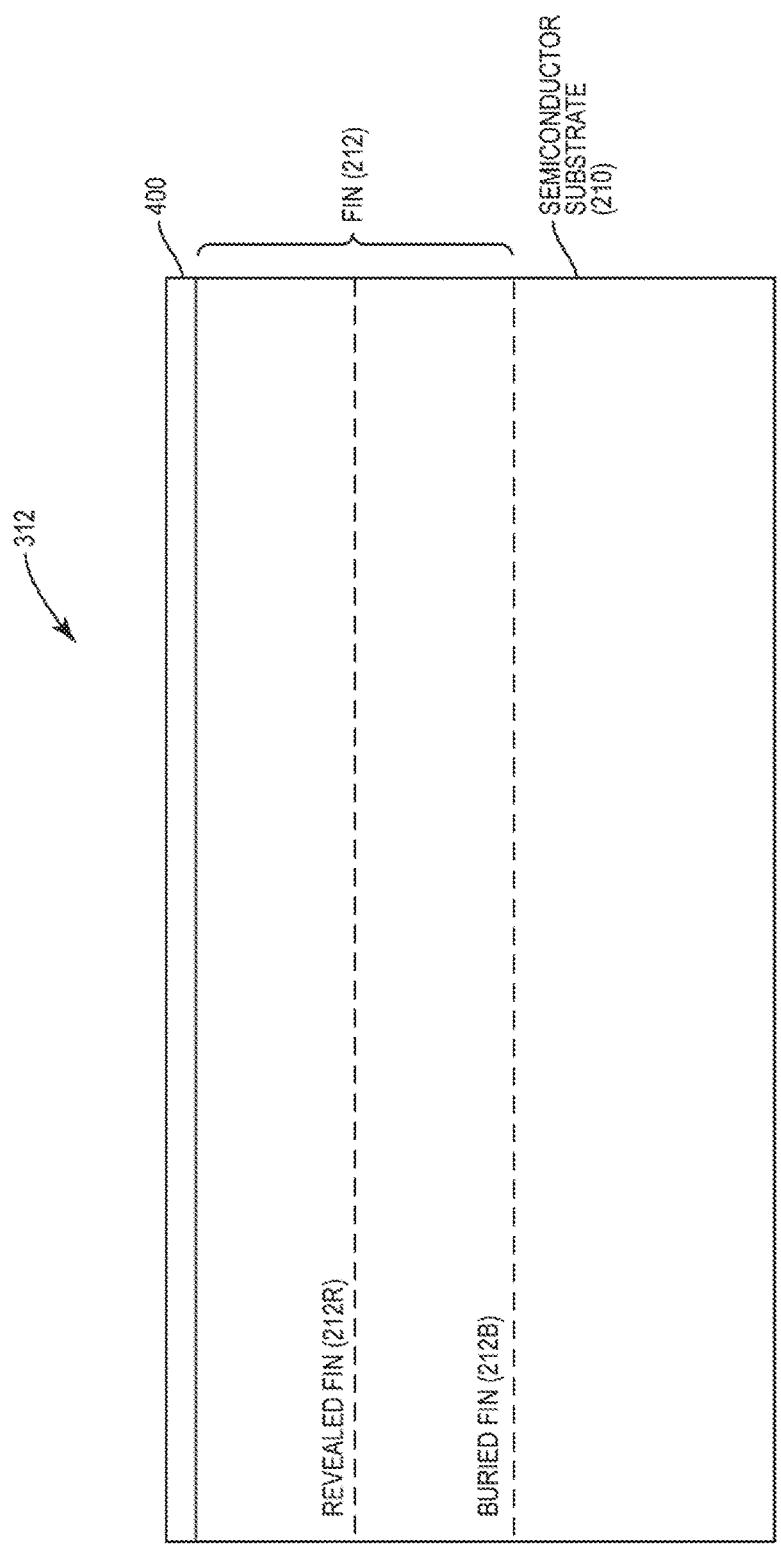
Figure 4C:
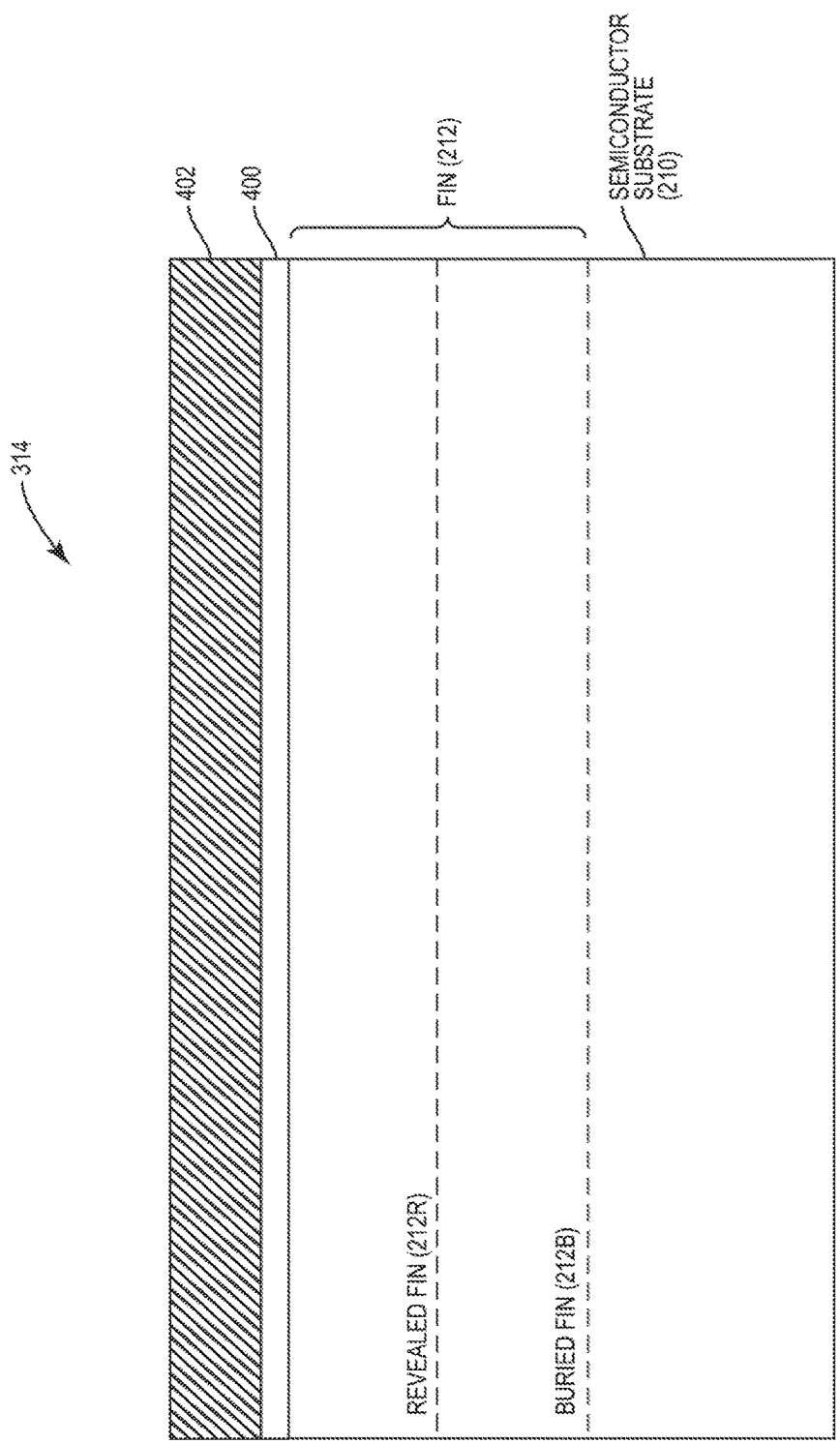
Figure 4D:
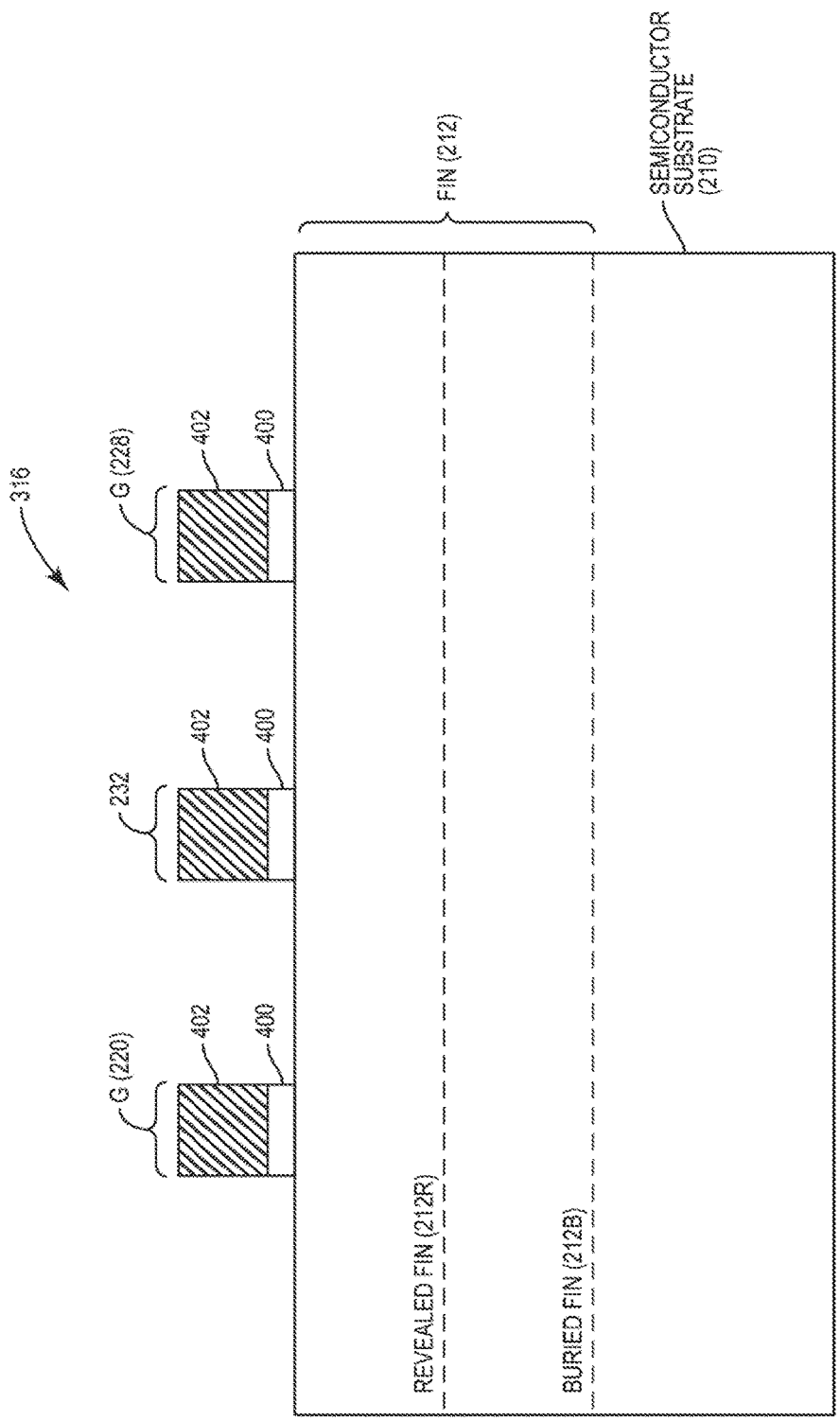
Figure 4E:
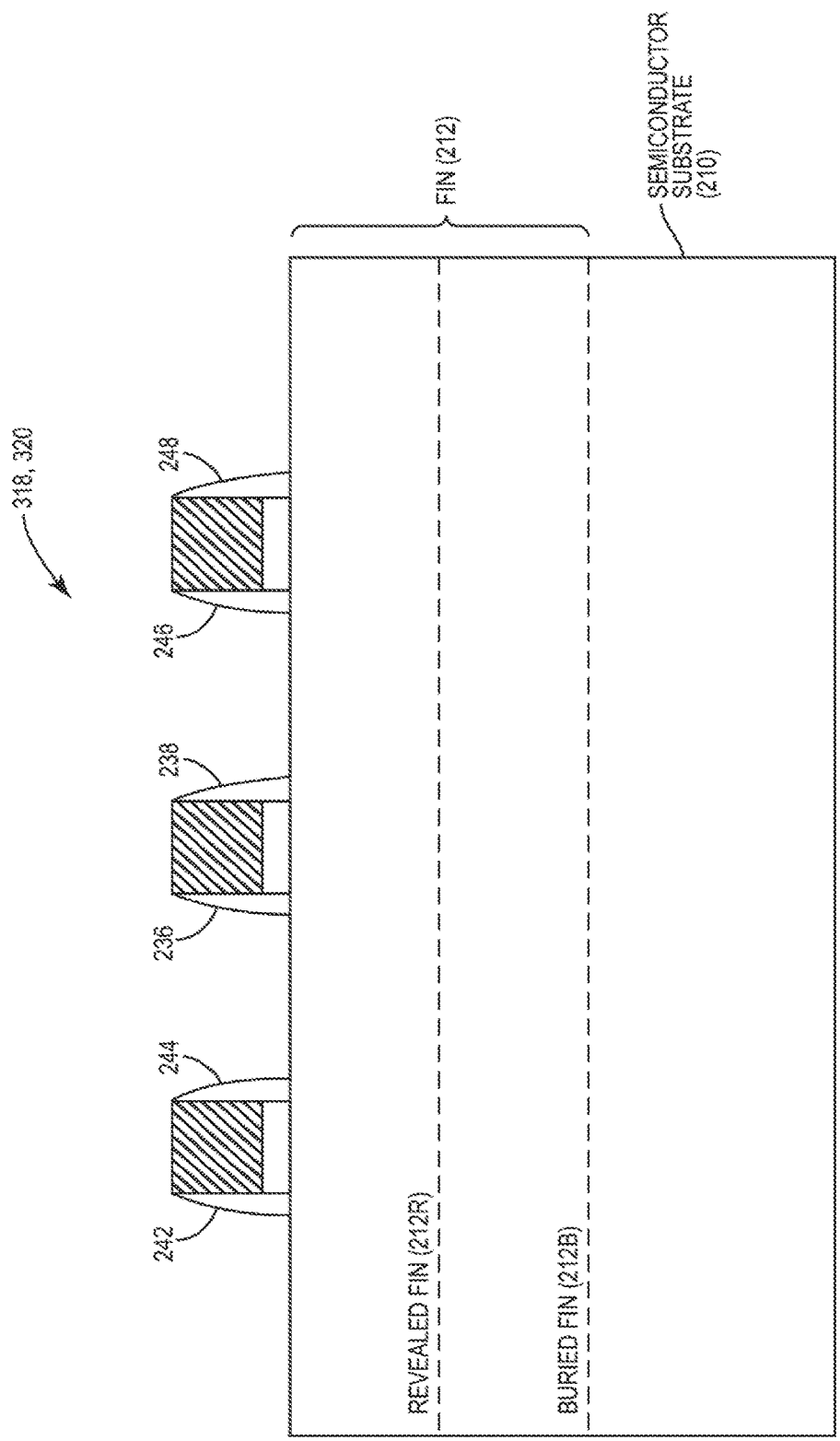
Figure 4F:
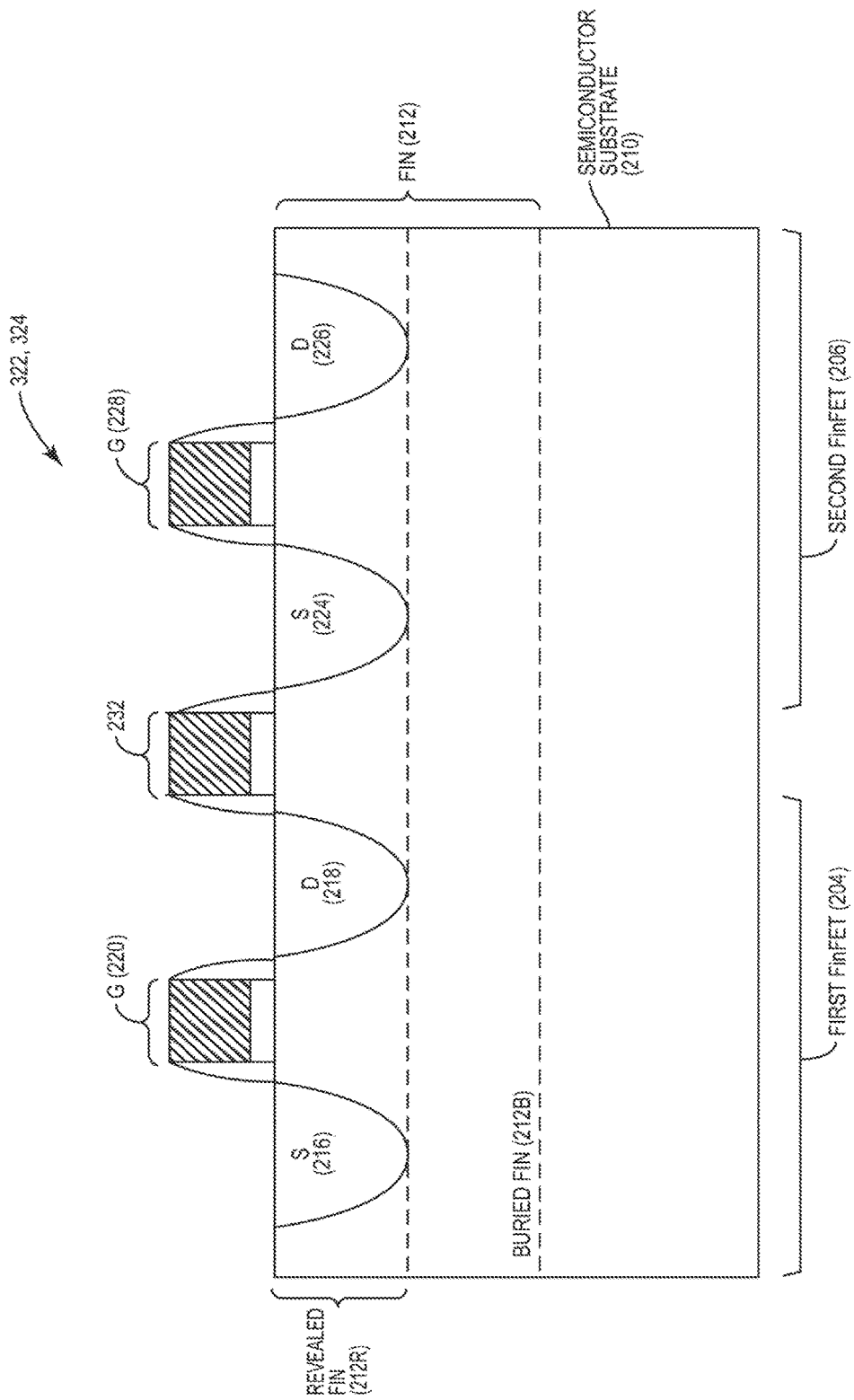
Figure 4G:
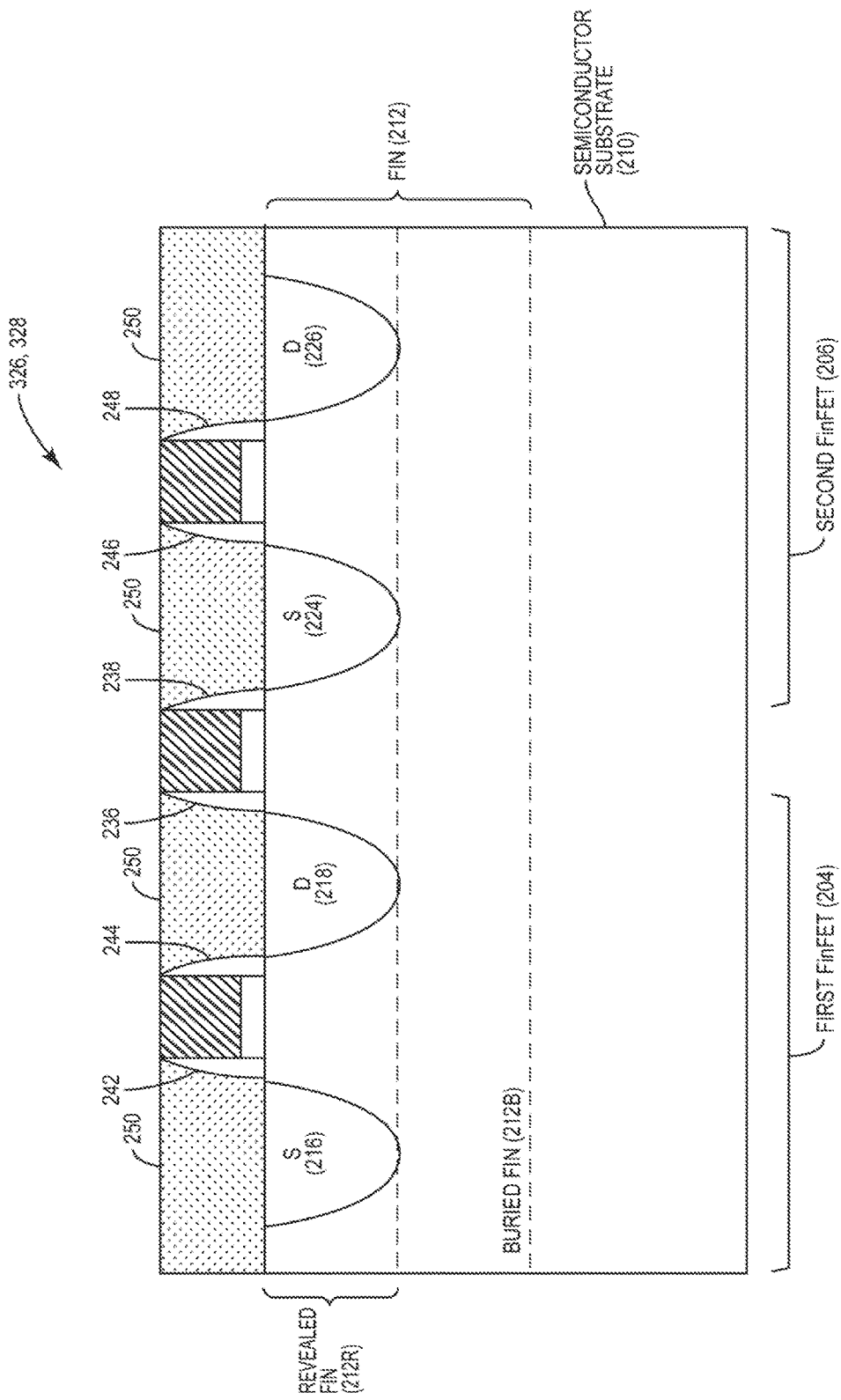

With continuing reference to FIG. 3A, block 302 can also include forming the first spacers 236, 242, and 246 on a side of each corresponding portion of the polysilicon layer 402 (block 318 and FIG. 4E). Block 302 can further include forming the second spacers 238, 244, and 248 on a side of each corresponding portion of the polysilicon layer 402 opposite the corresponding first spacers 236, 242, and 246 (block 320 and FIG. 4E). Additionally, block 302 can include etching the Fin 212 corresponding to the source 216, 224 and the drain 218, 226 of the first FinFET 204 and the second FinFET 206 (block 322 and FIG. 4F). Further, block 302 can include growing source and drain material in the source 216, 224 and drain 218, 226 for the first FinFET 204 and the second FinFET 206, respectively, using epitaxial processes (block 324 and FIG. 4F). Block 302 can also include disposing the ILD 250 on an outer side of each first spacer 236, 242, and 246 and on an outer side of each second spacer 238, 244, and 248 (block 326 and FIG. 4G). Further, block 302 can include planarizing the ILD 250 (block 328 and FIG. 4G).

Figure 4H:
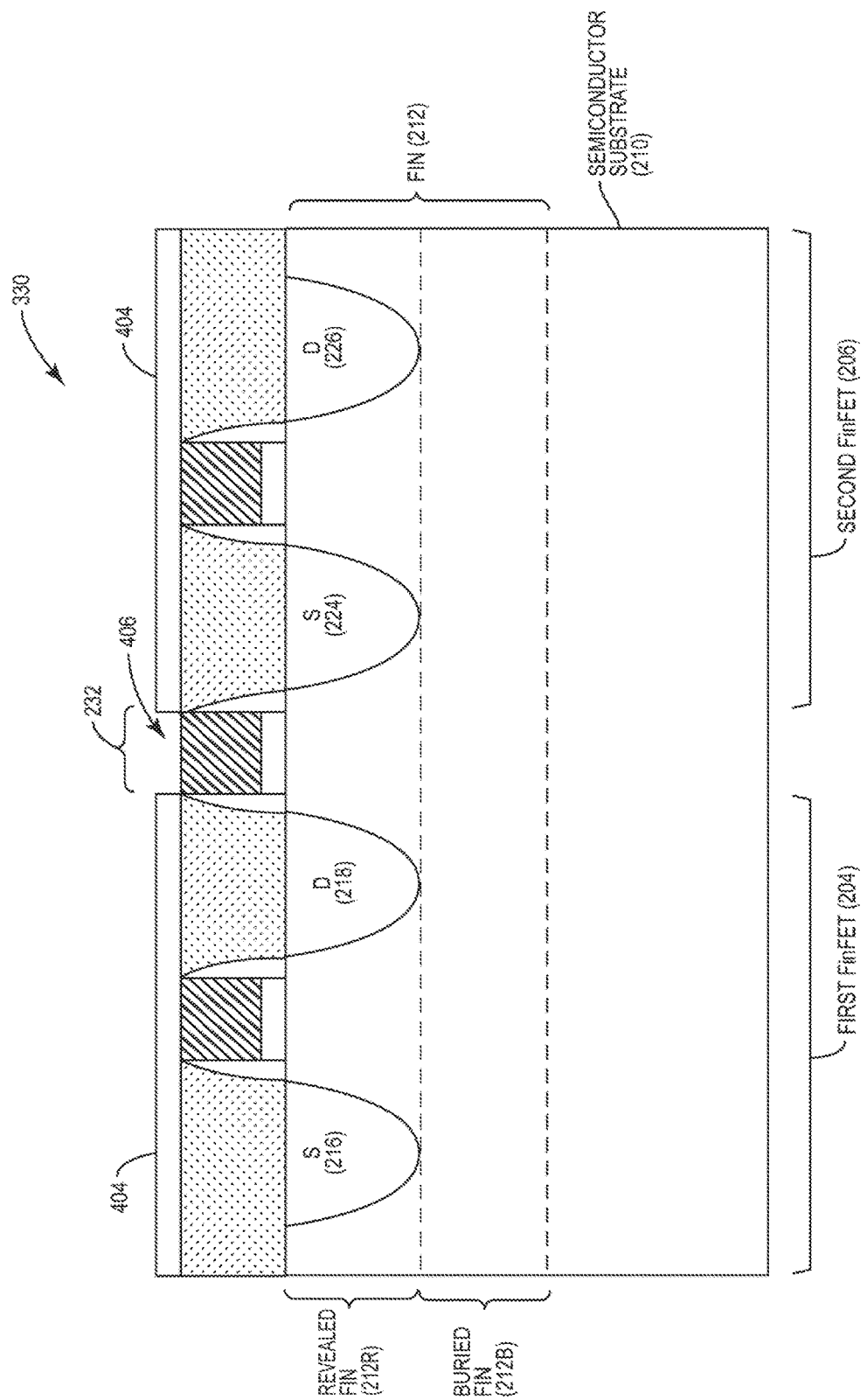
Figure 4I:
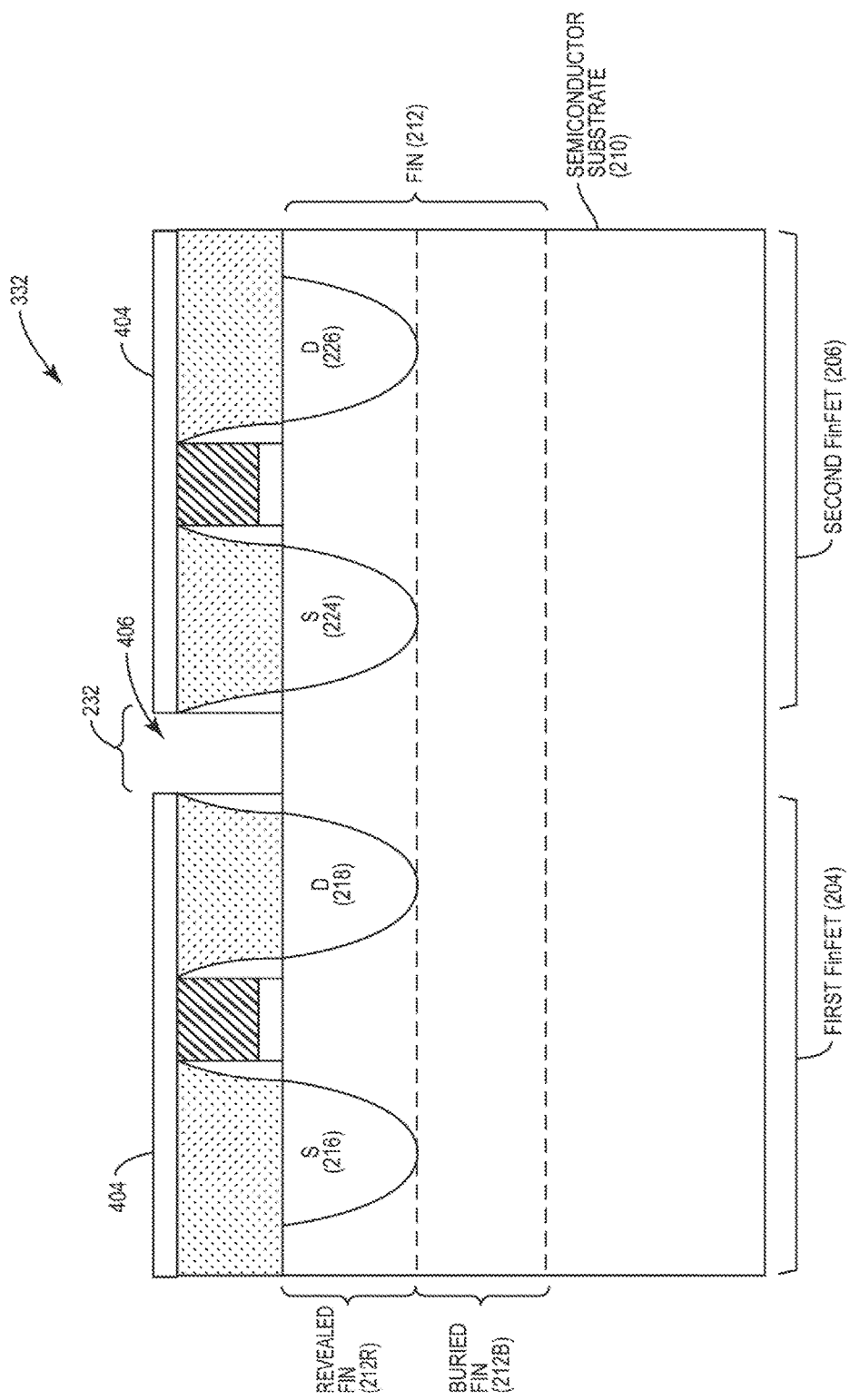

With reference to FIG. 3B, in response to providing the semiconductor substrate 210 according to block 302 and/or the steps described therein, the fabrication process 300 can also include disposing an oxide hard mask layer 404 having an opening 406 aligned with the gate region 232 (block 330 and FIG. 4H). The fabrication process 300 can also include etching the polysilicon layer 402 and the gate oxide layer 400 aligned with the opening 406 (block 332 and FIG. 4I). Further, the fabrication process 300 includes forming the self-aligned SDB isolation structure 202 in the Fin 212 between the first FinFET 204 and the second FinFET 206, and self-aligned with the gate region 232 (block 334 and FIG. 4J). As previously described, the self-aligned SDB isolation structure 202 electrically isolates the first and second FinFETs 204, 206, and applies stress to the first and second channels 222, 230. To form the self-aligned SDB isolation structure 202, block 326 can include etching the SDB trench 234 in the Fin 212 corresponding to the gate region 232 such that SDB trench 234 is self-aligned with the gate region 232 (block 336 and FIG. 4J). Additionally, block 334 can include disposing the dielectric material (KM) in the SDB trench 234 (block 338 and FIG. 4K). As noted above, the dielectric material (KM) can be disposed so as to be planar with the top surface 240 of the gates 220, 228.

As previously described, the self-aligned SDB isolation structure 202 can be configured to apply stress to the first and second channels 222, 230 in various ways. For example, the dielectric material (KM) used to fill the SDB trench 234 in block 338 can include porous silicon dioxide such that the SDB trench 234 applies tensile stress to the first and second channels 222, 230 when the first and second FinFETs 204, 206 are N-type FinFETs. Alternatively, the dielectric material (KM) used to fill the SDB trench 234 can include a layer of silicon buried by silicon dioxide or silicon nitride such that the SDB trench 234 applies compressive stress to the first and second channels 222, 230 when the first and second FinFETs 204, 206 are P-type FinFETs. Further, the depth DPT of the SDB trench 234 can be sized to tune the stress applied to the first and second channels 222, 230.

Figure 4K:
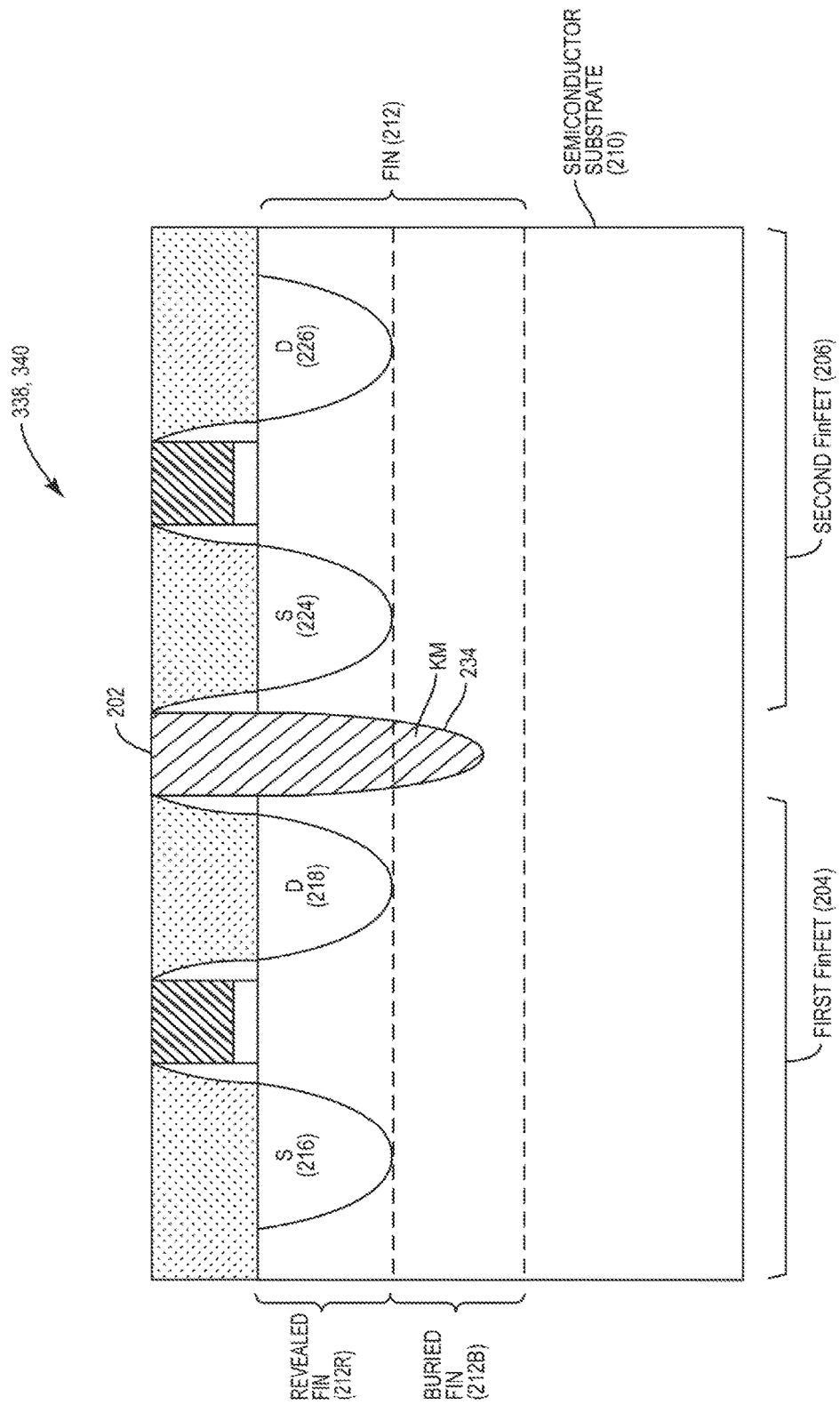
Figure 4L:
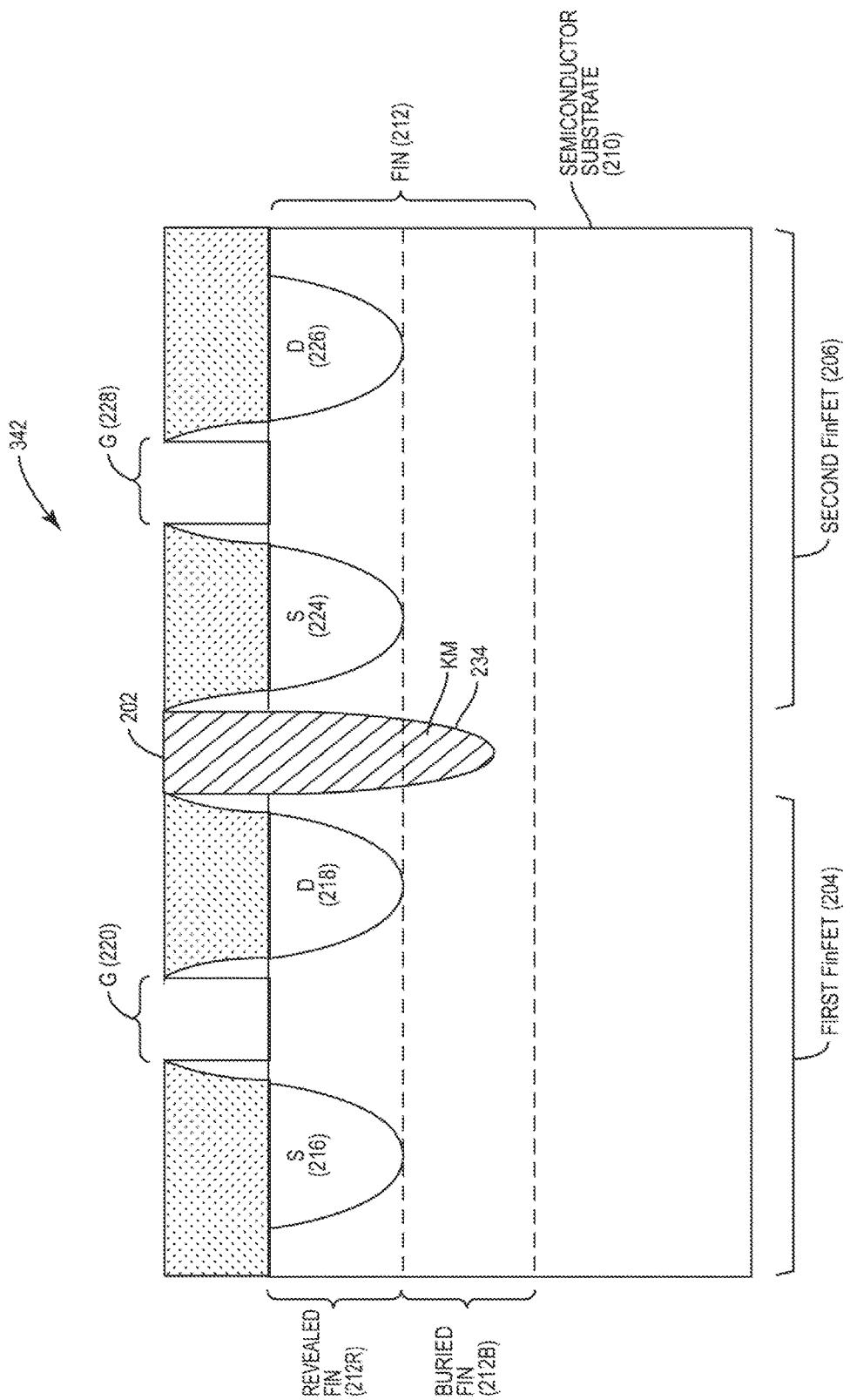
Figure 4M:
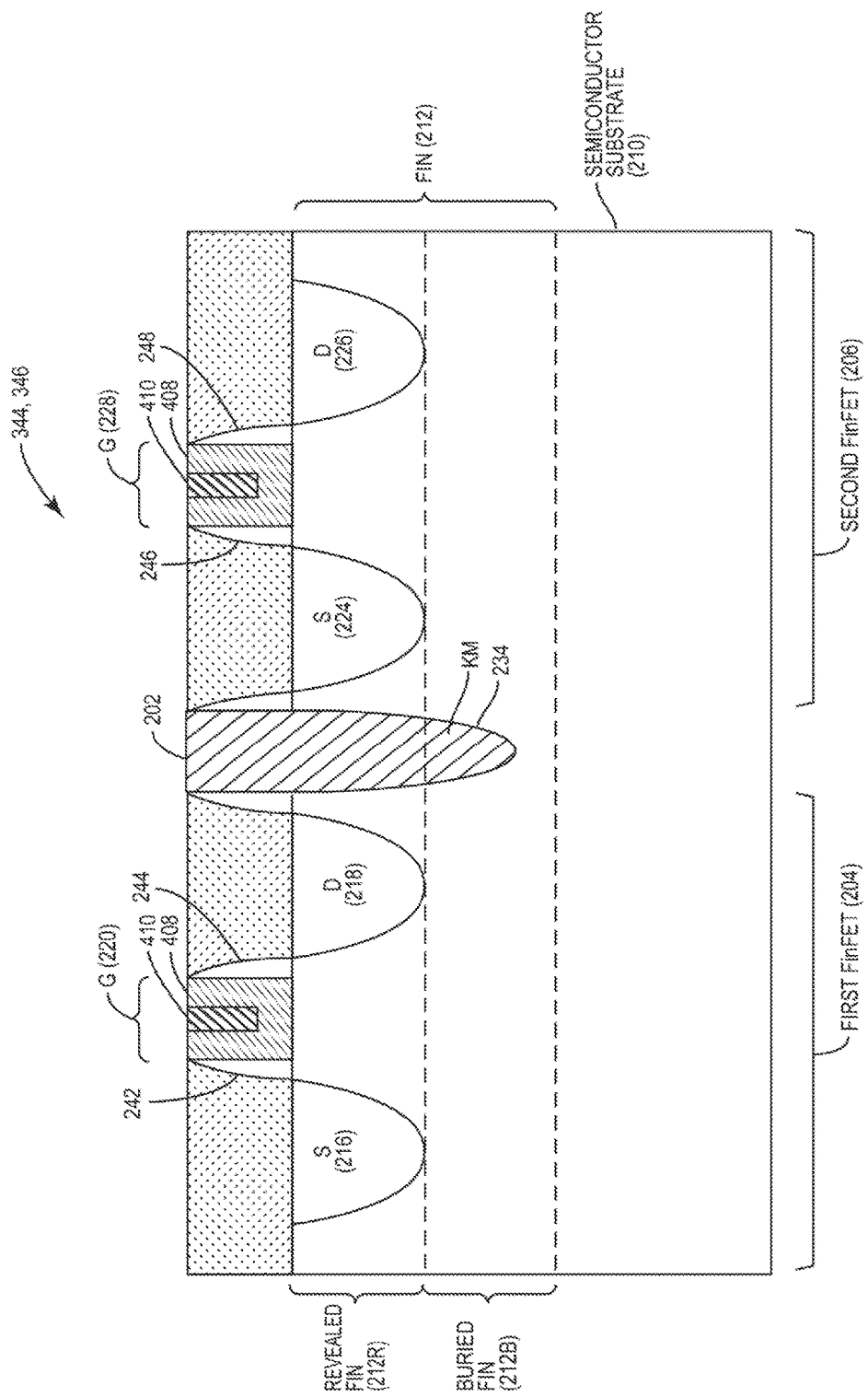

With continuing reference to FIG. 3B, the fabrication process 300 can also include removing the oxide hard mask layer 404 (block 340 and FIG. 4K). Additionally, the fabrication process 300 can include removing the portions of the polysilicon layer 402 and the gate oxide layer 400 corresponding to the gate 220 of the first FinFET 204 and the gate 228 of the second FinFET 206 (block 342 and FIG. 4L). The fabrication process 300 can also include disposing a dielectric layer 408 between the first spacers 242, 246 and the second spacers 244, 248 corresponding to the first and second FinFETs 204, 206 (block 344 and FIG. 4M). Further, the fabrication process 300 can include disposing a conductive layer 410 on the dielectric layer 408 of the first and second FinFETs 204, 206 so as to complete formation of the gates 220, 228 (block 346 and FIG. 4M).

To configure the self-aligned SDB isolation structure 202 to apply tensile or compressive stress based on whether the first and second FinFETs 204, 206 are N-type or P-type, respectively, the SDB process can be separately tuned for N-type and P-type FinFETs. For example, FIG. 5A includes a graph 500A illustrating threshold voltage (dVtlin) for exemplary N-type and P-type FinFETs corresponding to multiple SDB process versions 1-4. Additionally, FIG. 5B includes a graph 500B illustrating channel resistance (Rodlin) for exemplary N-type and P-type FinFETs corresponding to the multiple SDB process versions 1-4.

Figure 5A:
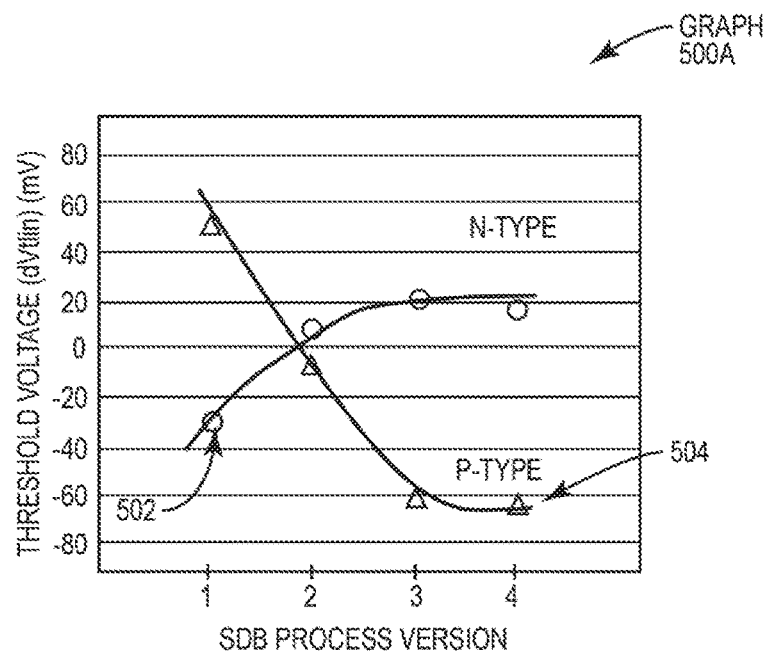
FIG. 5A is a graph illustrating threshold voltages for exemplary N-type and P-type FinFETs corresponding to multiple SDB process versions.
Figure 5B:
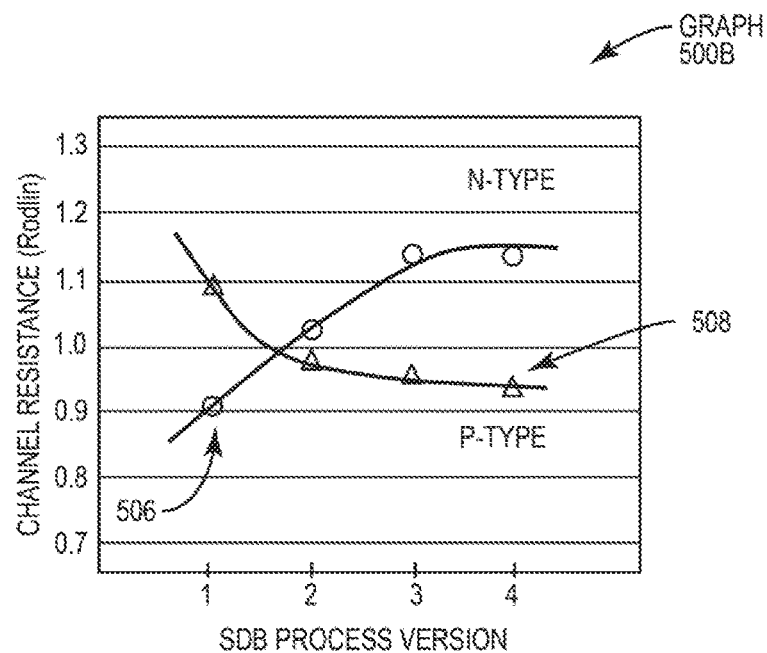
FIG. 5B is a graph illustrating channel resistance for exemplary N-type and P-type FinFETs corresponding to multiple SDB process variations.

In this regard, the graph 500A in FIG. 5A illustrates that the SDB process version 1 achieves the lowest threshold voltage (dVtlin) for N-type FinFETs (arrow 502), while the SDB process version 4 achieves the lowest threshold voltage (dVtlin) for P-type FinFETs (arrow 504). Further, the graph 500B in FIG. 5B illustrates that the SDB process version 1 achieves the lowest channel resistance (Rodlin) for N-type FinFETs (arrow 506), while the SDB process version 4 achieves the lowest channel resistance (Rodlin) for P-type FinFETs (arrow 508). Based on such findings, employing the SDB process version 1 to fabricate the self-aligned SDB isolation structure 202 provides higher performance for N-type FinFETs. Conversely, employing the SDB process version 4 to fabricate the self-aligned SDB isolation structure 202 provides higher performance for P-type FinFETs. Additionally, each of the multiple SDB process versions 1-4 corresponds to a specifically designed mask used to achieve the SDB process version in fabrication. Thus, to employ both N-type and P-type FinFETs in the IC 208, a mask corresponding to the SDB process version 1 and a mask corresponding to the SDB process version 4 are employed in fabrication. Conventional SDB processes are limited to one of the SDB process versions, and thus, one corresponding mask. Therefore, configuring separate instances of the self-aligned SDB isolation structure 202 with separate SDB process versions for N-type and P-type FinFETs in the same IC 208 adds one (1) additional mask to the fabrication process. Thus, applying channel stress to FinFETs as described herein increases the performance of the corresponding IC 208 while reducing or avoiding increased fabrication costs and complexity.

Figure 6:
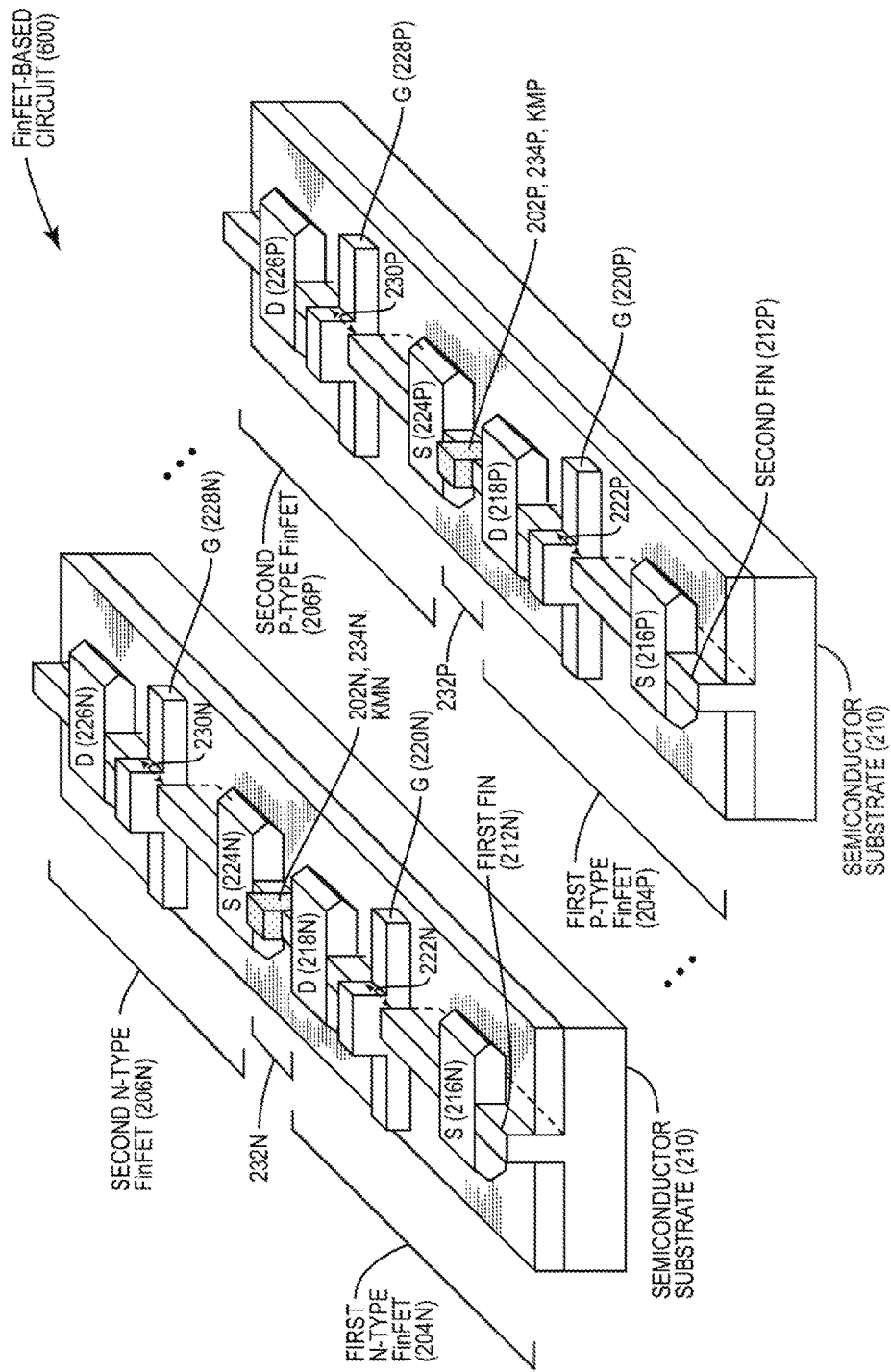
FIG. 6 is a perspective diagram of an exemplary FinFET-based circuit having a first self-aligned SDB isolation structure that applies stress to N-type FinFETs, and a second self-aligned SDB isolation structure that applies stress to P-type FinFETs.

In this regard, FIG. 6 illustrates an exemplary FinFET-based circuit 600 employing first and second N-type FinFETs 204N, 206N, as well as first and second P-type FinFETs 204P, 206P. The FinFET-based circuit 600 includes certain common components with the FinFET-based circuit 200 in FIG. 2A. Such components have similar element numbers between FIGS. 2A and 6, wherein components corresponding to the N-type portion include an "N" appended to the element number, and components corresponding to the P-type portion include a "P" appended to the element number. Common elements between FIGS. 2A and 6 will not be re-described herein.

With continuing reference to FIG. 6, the FinFET-based circuit 600 includes a first Fin 212N and a second Fin 212P, each of which is formed from a semiconductor substrate 210. The FinFET-based circuit 600 also includes a first self-aligned SDB isolation structure 202N in the first Fin 212N and self-aligned with a first gate region 232N. The first self-aligned SDB isolation structure 202N includes a first SDB trench 234N filled with a first dielectric material (KMN) so as to apply stress to the first and second N-type FinFETs 204N, 206N. For example, the first SDB trench 234N can include porous silicon dioxide so as to cause tensile stress on first and second N-type channels 222N, 230N, as described above. The FinFET-based circuit 600 also employs a second self-aligned SDB isolation structure 202P in the second Fin 212P and self-aligned with the second gate region 232P. The second self-aligned SDB isolation structure 202P includes a second SDB trench 234P filled with a second dielectric material (KMP) so as to apply compressive stress to the first and second P-type FinFETs 204P, 206P. In this aspect, the second dielectric material (KMP) is different from the first dielectric material (KMN). For example, the second SDB trench 234P can include a layer of silicon buried by silicon dioxide or silicon nitride so as to apply compressive stress to first and second P-type channels 222P, 230P, as described above. In this manner, the first and second self-aligned SDB isolation structures 202N, 202P can be separately tuned such that the corresponding type of stress can be applied to the first and second N-type FinFETs 204N, 206N and the first and second P-type FinFETs 204P, 206P, respectively.

The elements described herein are sometimes referred to as means for achieving a particular property. In this regard, the semiconductor substrate 210 is sometimes referred to herein as "a means for providing a semiconductor substrate." The Fin 212 is sometimes referred to herein as "a means for forming a Fin from the semiconductor substrate." The first FinFET 204 is sometimes referred to herein as "a means for forming a first FinFET corresponding to the Fin." The second FinFET 206 is sometimes referred to herein as "a means for forming a second FinFET corresponding to the Fin." The gate region 232 is sometimes referred to herein as "a means for disposing a gate region between the first FinFET and the second FinFET." The self-aligned SDB isolation structure 202 is sometimes referred to herein as "a means for forming a self-aligned SDB isolation structure in the Fin between the first FinFET and the second FinFET and self-aligned with the gate region, wherein the self-aligned SDB isolation structure electrically isolates the first FinFET and the second FinFET and applies stress to a first channel corresponding to the first FinFET and to a second channel corresponding to the second FinFET."

Applying channel stress to FinFETs using a self-aligned SDB isolation structure according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
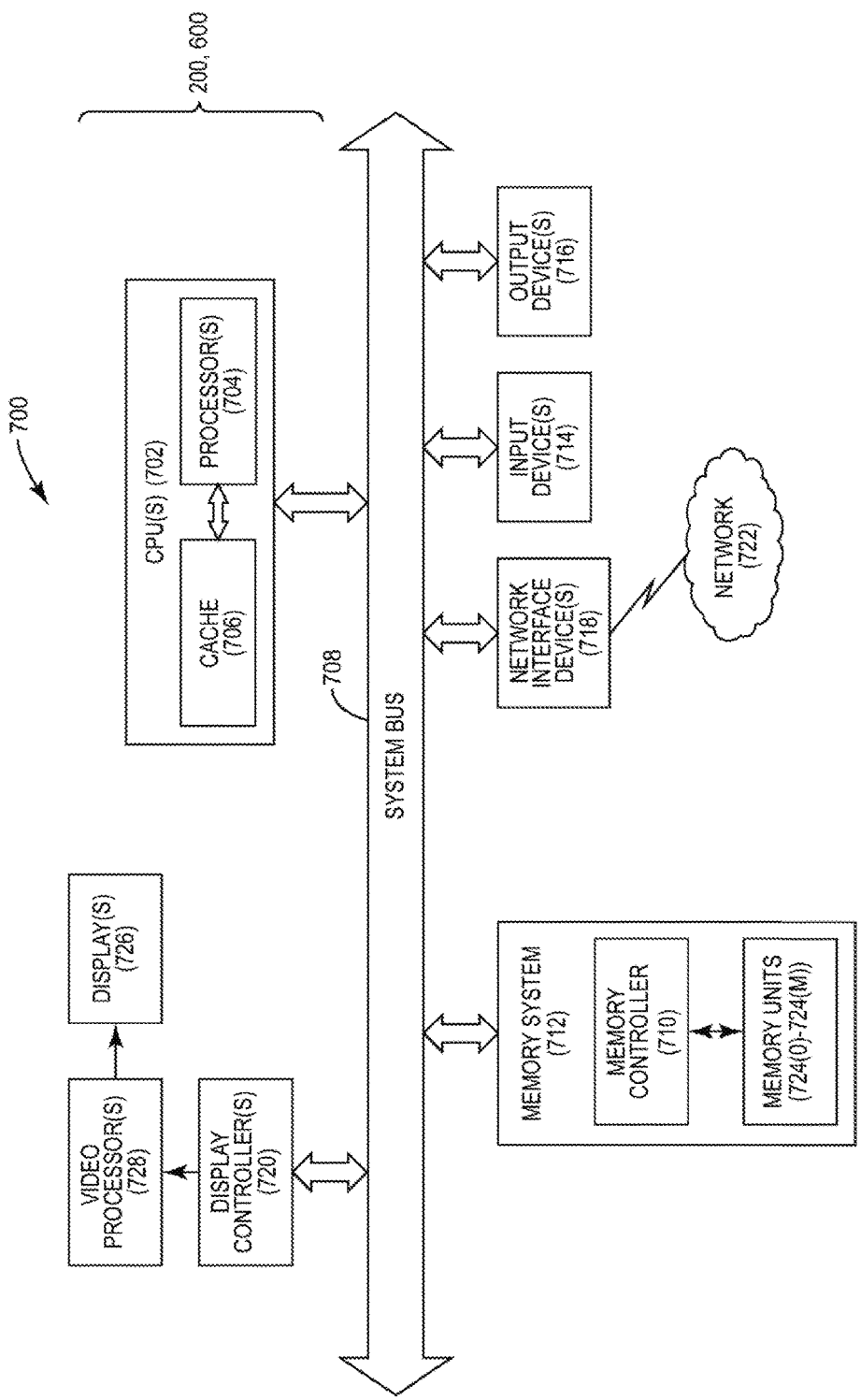
FIG. 7 is a block diagram of an exemplary processor-based system that can include the FinFET-based circuits having the self-aligned SDB isolation structures in FIGS. 2A, 2B, and 6.

In this regard, FIG. 7 illustrates an example of a processor-based system 700 that includes elements that can employ the FinFET-based circuit 200 in FIGS. 2A and 2B. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any device configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0)-724(M).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A Fin field-effect transistor (FET) (FinFET)-based circuit, comprising:
    a semiconductor substrate;
    a Fin formed from the semiconductor substrate;
    a first FinFET corresponding to the Fin;
    a second FinFET corresponding to the Fin;
    a gate region disposed between the first FinFET and the second FinFET; and
    a self-aligned single diffusion break (SDB) isolation structure formed in the Fin between the first FinFET and the second FinFET and self-aligned with the gate region, wherein the self-aligned SDB isolation structure electrically isolates the first FinFET and the second FinFET and applies stress to a first channel corresponding to the first FinFET and to a second channel corresponding to the second FinFET.

2. The FinFET-based circuit of claim 1, wherein the self-aligned SDB isolation structure comprises an SDB trench etched into the Fin, the SDB trench filled with a dielectric material.

3. The FinFET-based circuit of claim 2, further comprising:
    a first spacer disposed adjacent to the gate region; and
    a second spacer disposed adjacent to the gate region opposite the first spacer,
    wherein the SDB trench is formed between the first spacer and the second spacer.

4. The FinFET-based circuit of claim 3, wherein the dielectric material of the self-aligned SDB isolation structure is planar with a top surface of a gate corresponding to the first FinFET.

5. The FinFET-based circuit of claim 2, wherein the first FinFET comprises a first N-type FinFET and the second FinFET comprises a second N-type FinFET.

6. The FinFET-based circuit of claim 5, wherein the dielectric material disposed in the SDB trench comprises porous silicon dioxide such that the SDB trench applies tensile stress to a first channel of the first N-type FinFET and to a second channel of the second N-type FinFET.

7. The FinFET-based circuit of claim 2, wherein the first FinFET comprises a first P-type FinFET and the second FinFET comprises a second P-type FinFET.

8. The FinFET-based circuit of claim 7, wherein the dielectric material disposed in the SDB trench comprises a layer of silicon buried by silicon dioxide such that the SDB trench applies compressive stress to a first channel of the first P-type FinFET and to a second channel of the second P-type FinFET.

9. The FinFET-based circuit of claim 7, wherein the dielectric material disposed in the SDB trench comprises a layer of silicon buried by silicon nitride such that the SDB trench applies compressive stress to a first channel of the first P-type FinFET and to a second channel of the second P-type FinFET.

10. The FinFET-based circuit of claim 1, wherein:
    the first FinFET comprises a first N-type FinFET and the second FinFET comprises a second N-type FinFET; and
    the FinFET-based circuit further comprises:
        a second Fin formed from the semiconductor substrate;
        a first P-type FinFET corresponding to the second Fin;
        a second P-type FinFET corresponding to the second Fin;
        a second gate region disposed between the first P-type FinFET and the second P-type FinFET; and
        a second self-aligned SDB isolation structure formed in the second Fin between the first P-type FinFET and the second P-type FinFET and self-aligned with the second gate region, wherein the second self-aligned SDB isolation structure electrically isolates the first P-type FinFET and the second P-type FinFET and applies stress to a first P-type channel corresponding to the first P-type FinFET and to a second P-type channel corresponding to the second P-type FinFET.

11. The FinFET-based circuit of claim 10, wherein:
    the self-aligned SDB isolation structure comprises a first SDB trench etched into the Fin, the first SDB trench filled with a first dielectric material; and
    the second self-aligned SDB isolation structure comprises a second SDB trench etched into the second Fin, the second SDB trench filled with a second dielectric material different from the first dielectric material.

12. The FinFET-based circuit of claim 1 integrated into an integrated circuit (IC).

13. The FinFET-based circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

14. A Fin field-effect transistor (FET) (FinFET)-based circuit, comprising:
   a means for providing a semiconductor substrate;
   a means for forming a Fin from the semiconductor substrate;
   a means for forming a first FinFET corresponding to the Fin;
   a means for forming a second FinFET corresponding to the Fin;
   a means for disposing a gate region between the first FinFET and the second FinFET; and
   a means for forming a self-aligned single diffusion break (SDB) isolation structure in the Fin between the first FinFET and the second FinFET and self-aligned with the gate region, wherein the self-aligned SDB isolation structure electrically isolates the first FinFET and the second FinFET and applies stress to a first channel corresponding to the first FinFET and to a second channel corresponding to the second FinFET.

15. A method of fabricating a Fin field-effect transistor (FET) (FinFET)-based circuit, comprising:
   providing a semiconductor substrate comprising a Fin formed from the semiconductor substrate, a first Fin-FET corresponding to the Fin, a second FinFET corresponding to the Fin, and a gate region disposed between the first FinFET and the second FinFET; and
   forming a self-aligned single diffusion break (SDB) isolation structure in the Fin between the first FinFET and the second FinFET and self-aligned with the gate region, wherein the self-aligned SDB isolation structure electrically isolates the first FinFET and the second FinFET and applies stress to a first channel corresponding to the first FinFET and to a second channel corresponding to the second FinFET.

16. The method of claim 15, further comprising:
   disposing an oxide hard mask layer comprising an opening aligned with the gate region;
   etching a polysilicon layer and a gate oxide layer aligned with the opening; and
   removing the oxide hard mask layer.

17. The method of claim 15, wherein forming the self-aligned SDB isolation structure comprises:
   etching an SDB trench in the Fin corresponding to the gate region such that the SDB trench is self-aligned with the gate region; and
   disposing a dielectric material in the SDB trench.

18. The method of claim 17, wherein the disposing the dielectric material comprises disposing the dielectric material to be planar with a top surface of a gate of the first FinFET.

19. The method of claim 17, wherein providing the semiconductor substrate comprises providing the semiconductor substrate wherein the first FinFET comprises a first N-type FinFET and the second FinFET comprises a second N-type FinFET.

20. The method of claim 19, wherein disposing the dielectric material in the SDB trench comprises disposing porous silicon dioxide in the SDB trench such that the SDB trench applies tensile stress to a first channel of the first N-type FinFET and to a second channel of the second N-type FinFET.

21. The method of claim 17, wherein providing the semiconductor substrate comprises providing the semiconductor substrate wherein the first FinFET comprises a first P-type FinFET and the second FinFET comprises a second P-type FinFET.

22. The method of claim 21, wherein disposing the dielectric material in the SDB trench comprises disposing a layer of silicon buried by silicon dioxide in the SDB trench such that the SDB trench applies compressive stress to a first channel of the first P-type FinFET and to a second channel of the second P-type FinFET.

23. The method of claim 21, wherein disposing the dielectric material in the SDB trench comprises disposing a layer of silicon buried by silicon nitride in the SDB trench such that the SDB trench applies compressive stress to a first channel of the first P-type FinFET and to a second channel of the second P-type FinFET.

24. The method of claim 17, further comprising annealing the FinFET-based circuit.

25. The method of claim 24, wherein annealing the FinFET-based circuit comprises annealing the FinFET-based circuit using laser annealing.

26. The method of claim 24, wherein annealing the FinFET-based circuit comprises annealing the FinFET-based circuit using rapid thermal annealing.

27. The method of claim 15, wherein providing the semiconductor substrate comprises:
   etching the semiconductor substrate to form the Fin;
   growing an oxide layer on the semiconductor substrate and the Fin;
   polishing the oxide layer to be planar with the Fin;
   etching the oxide layer to reveal a portion of the Fin;
   growing a gate oxide layer on the Fin;
   disposing a polysilicon layer on the semiconductor substrate and the gate oxide layer;
   etching the polysilicon layer such that portions of the polysilicon layer reside on the semiconductor substrate and the gate oxide layer corresponding to the gate region, a gate corresponding to the first FinFET, and a gate corresponding to the second FinFET;
   forming a corresponding first spacer on a side of each portion of the polysilicon layer; and
   forming a corresponding second spacer on a side of each portion of the polysilicon layer opposite the corresponding first spacer;
   etching the Fin corresponding to a source and drain of the first FinFET and the second FinFET;
   growing source and drain material in the source and drain corresponding to the first FinFET and the second FinFET using epitaxial processes;
   disposing an interlayer dielectric oxide (ILD) on an outer side of each first spacer and on an outer side of each second spacer; and
   planarizing the ILD.

28. The method of claim 15, further comprising:
   removing a polysilicon layer and a gate oxide layer corresponding to a gate of the first FinFET and a gate of the second FinFET;
   disposing a dielectric layer between first spacers and second spacers corresponding to the first FinFET and the second FinFET; and
   disposing a conductive layer on the dielectric layer of the first FinFET and the second FinFET.

* * * * *